(12) United States Patent
Kasagani et al.

(10) Patent No.: US 10,098,236 B2
(45) Date of Patent: Oct. 9, 2018

(54) USE OF COMBINED MASKING TECHNIQUES AND/OR COMBINED MATERIAL REMOVAL TECHNIQUES TO PROTECTIVELY COAT ELECTRONIC DEVICES

(71) Applicant: HZO, Inc., Draper, UT (US)

(72) Inventors: Vimal Kumar Kasagani, Taylorsville, UT (US); Colin LaMar Loose, Layton, UT (US); Tyler Christensen Child, South Jordan, UT (US); Caleb Edward Kanavel, Sandy, UT (US); Heidi L. Popeck, Herriman, UT (US); Samuel R. Anderson, Salt Lake City, UT (US); Cameron LaMar Loose, Roy, UT (US); Xiaowei Shen, Draper, UT (US)

(73) Assignee: HZO, INC., Draper, UT (US)

( * ) Notice: Subject to any disclaimer, the term of this patent is extended or adjusted under 35 U.S.C. 154(b) by 228 days.

(21) Appl. No.: 14/836,875

(22) Filed: Aug. 26, 2015

(65) Prior Publication Data
US 2016/0345440 A1 Nov. 24, 2016

Related U.S. Application Data

(60) Provisional application No. 62/041,752, filed on Aug. 26, 2014, provisional application No. 62/042,921, (Continued)

(51) Int. Cl.
*H05K 3/28* (2006.01)
*H05K 1/14* (2006.01)
(Continued)

(52) U.S. Cl.
CPC ............ *H05K 3/284* (2013.01); *B05B 12/24* (2018.02); *B05B 12/26* (2018.02); *B05D 1/32* (2013.01);
(Continued)

(58) Field of Classification Search
CPC ........ H05K 1/148; H05K 3/0079; H05K 3/28; H05K 3/284; H05K 3/285; H05K 3/288;
(Continued)

(56) References Cited

U.S. PATENT DOCUMENTS 4,059,708 A * 11/1977 Heiss, Jr. ............... H01L 21/32
257/E21.258
4,255,469 A * 3/1981 McGinness ......... B05B 15/0456
156/247

(Continued)

*Primary Examiner* — Peter DungBa Vo
*Assistant Examiner* — Joshua D Anderson
(74) *Attorney, Agent, or Firm* — Jeff Holman; Kunzler, PC

(57) ABSTRACT

Processes for masking electronic devices, including, but not limited to, electronic subassemblies, prior to the application of protective coatings to the electronic devices are disclosed. Such processes include the use of a plurality of different masking techniques in combination to mask the electronic device. Different masking techniques may be used to mask different features and/or components of the electronic device. Some features and/or components may be masked by way of two or more masking techniques. With one or more masks in place, an electronic device may be protectively coated. After a protective coating has been applied to the electronic device, at least a portion of the mask(s) may be removed from the electronic device. Protectively coated electronic devices may then be assembled with one another.

8 Claims, 11 Drawing Sheets

Related U.S. Application Data filed on Aug. 28, 2014, provisional application No. 62/048,904, filed on Sep. 11, 2014.

(51) Int. Cl.

| | |
|---|---|
| *H05K 13/00* | (2006.01) |
| *H05K 3/30* | (2006.01) |
| *H05K 3/36* | (2006.01) |
| *H05K 5/00* | (2006.01) |
| *H05K 5/02* | (2006.01) |
| *B05D 1/32* | (2006.01) |
| *B05D 5/00* | (2006.01) |
| *H01L 21/56* | (2006.01) |
| *H05K 3/00* | (2006.01) |
| *H04N 5/225* | (2006.01) |
| *B05B 12/24* | (2018.01) |
| *B05B 12/26* | (2018.01) |

(52) U.S. Cl.
CPC ............... *B05D 5/00* (2013.01); *H01L 21/56* (2013.01); *H04N 5/2257* (2013.01); *H05K 1/148* (2013.01); *H05K 3/0079* (2013.01); *H05K 3/285* (2013.01); *H05K 3/288* (2013.01); *H05K 3/30* (2013.01); *H05K 3/36* (2013.01); *H05K 5/0017* (2013.01); *H05K 5/0026* (2013.01); *H05K 5/0286* (2013.01); *H05K 13/0023* (2013.01); *H05K 3/28* (2013.01); *H05K 3/361* (2013.01); *H05K 2201/10037* (2013.01); *H05K 2201/10128* (2013.01); *H05K 2203/1316* (2013.01); *H05K 2203/1327* (2013.01); *H05K 2203/1383* (2013.01)

(58) Field of Classification Search
CPC ............ H05K 3/30; H05K 3/36; H05K 3/361; H05K 13/0023; H05K 2203/1383; H05K 2203/1327; H05K 2203/10128; H05K 2203/10037; H05K 2203/1316; H01L 21/56; B05B 15/0462; B05B 15/0456; B05D 1/32; B05D 5/00; Y10T 29/4913; Y10T 29/49146; Y10T 29/49208

See application file for complete search history.

(56) References Cited

U.S. PATENT DOCUMENTS

| | | | | |
|---|---|---|---|---|
| 5,460,767 A | * | 10/1995 | Sanftleben | ............ B29C 39/021 156/155 |
| 2013/0174410 A1 | * | 7/2013 | Stevens | ................... H05K 3/282 29/592.1 |
| 2013/0176691 A1 | * | 7/2013 | Stevens | ..................... H05K 3/28 361/748 |
| 2013/0176700 A1 | * | 7/2013 | Stevens | .................. H05K 1/185 361/760 |
| 2015/0275021 A1 | * | 10/2015 | Saba | ....................... H04M 1/18 428/336 |

* cited by examiner

USE OF COMBINED MASKING TECHNIQUES AND/OR COMBINED MATERIAL REMOVAL TECHNIQUES TO PROTECTIVELY COAT ELECTRONIC DEVICES

CROSS-REFERENCE TO RELATED APPLICATIONS

Claims to the benefit of the Aug. 26, 2014, filing date of U.S. Provisional Patent Application 62/041,752, titled PROCESSES FOR PROTECTIVELY COATING ELECTRONIC DEVICES ("the '752 Provisional Application"), the Aug. 28, 2014, filing date of U.S. Provisional Patent Application 62/042,921, titled PROCESSES FOR PROTECTIVELY COATING ELECTRONIC DEVICES THAT INCLUDE DISPLAYS ("the '921 Provisional Application"), and the Sep. 11, 2014, filing date of U.S. Provisional Patent Application 62/048,904, titled PROCESSES FOR PROTECTIVELY COATING MOBILE TELEPHONES ("the '904 Provisional Application"), are hereby made pursuant to 35 U.S.C. § 119(e). The entire disclosures of the '752 Provisional Application, the '921 Provisional Application and the '904 Provisional Application are hereby incorporated by reference.

TECHNICAL FIELD

This disclosure relates generally to processes for applying protective coatings to electronic device subassemblies and electronic device assemblies, such as mobile telephones, tablet computing devices and the like. This disclosure also relates to processes that precede and follow the application of a protective coating to features and/or components of an electronic device subassembly or to an electronic device assembly, including processes that are configured to expose features and/or components of the electronic device assembly through the protective coating.

SUMMARY

Processes that employ a plurality of techniques for masking features or components of an electronic device to prevent the application of a protective coating to those features or components are disclosed. As used herein, the phrase "electronic device" has the same meaning as commonly understood by one of ordinary skill in the art to which the disclosed subject matter pertains and includes electronic device subassemblies (e.g., a printed circuit board (PCB) and the various devices have been mounted to the PCB or that are otherwise carried by the PCB) and to electronic device assemblies (e.g. assemblies of a PCB, the devices carried by the PCB and other components that have been connected to, but are not carried by, the PCB). An electronic device assembly may comprise a partially assembled electronic device or an assembled electronic device.

A variety of different processes may be used to mask different features of an electronic device. These masking processes may include the use of flowable masking materials, tapes, decals and inserts for recesses and/or receptacles of the electronic device.

A fluid masking material may conform to the shape(s) of a feature to which it is applied. In some embodiments, the fluid masking material may comprise a hardenable masking material, e.g., a material that hardens in place after application to the feature or component to be masked. In other embodiments, the fluid masking material may not harden after application to the feature or component to be masked, or it may comprise a "non-hardenable" masking material. Fluid masking materials may be in a liquid state or in a semisolid state when they are applied to an electronic device. For the sake of simplicity, fluid masking materials may also be referred to herein as "liquid masking materials."

In some embodiments, in addition to applying a fluid masking material to a feature and/or component that is to be masked, once the fluid masking material has been applied to the feature and/or component, pressure may be applied to the fluid masking material. The amount of pressure applied to the fluid masking material may be predetermined. A duration of time the pressure is applied to the fluid masking material may be predetermined. The application of pressure to the fluid masking material may ensure that the fluid masking material properly fills any recesses and/or receptacles. Pressure may also be applied to the fluid masking material to cause it to spread out over a desired area on the feature and/or component to which the fluid masking material has been applied. In some embodiments, the quantity of the fluid masking material that is applied to the feature and/or component, the amount of pressure that is applied to the fluid masking material (e.g., a predetermined amount of pressure) and/or the amount of time that the pressure is applied to the fluid masking material (e.g., a predetermined duration of time) may be tailored to cause the fluid masking material to cover a particular area of the feature and/or component.

A tape may comprise a strip of suitable material (e.g., a paper or paper-like material, a fabric, or a polymeric film) with one surface that has been coated with an adhesive material (e.g., a pressure-sensitive adhesive or a curable adhesive).

A decal may comprise a flat element that is formed to a desired shape from a suitable material (e.g., a paper or paper-like material, a fabric, or a polymeric film). The decal may be pre-cut (e.g., die-cut) to the desired shape. The desired shape may comprise a predetermined shape that corresponds to a shape of a feature, a component or a collection of features and/or components of an electronic device that is to be masked. In some embodiments, the decal may include a surface to which a suitable adhesive material (e.g., a pressure-sensitive adhesive or a curable adhesive) has been applied.

An insert may comprise a preformed structure. The insert may be configured complementarily to and be insertable into a receptacle of an electronic device (e.g., an electrical connector, a port (e.g., a communication port or a power charging port), a card slot (e.g., a subscriber identity module (SIM) card slot or a secure digital (SD) card slot), a card reader, an opening for a microphone and/or a speakers, or a headphone jack). In some embodiments, the preformed structure may consist of a rigid element. Alternatively, the preformed structure may comprise a rigid element. In some embodiments, the preformed structure may include a rigid element and a compressible, resilient element. The rigid element may facilitate insertion of the insert into a receptacle and, optionally, its removal from the receptacle. The compressible, resilient element, if any, may enable the insert to seal against an adjacent surface of the receptacle and/or of the electronic device of which the receptacle is a part.

In some embodiments, a particular feature or component of an electronic device may be masked by way of a combination of techniques. Without limitation, fluid masking materials may be used in conjunction with preformed masking elements, such as decals and preformed inserts. More specifically, a fluid masking material may be used to form a seal between the electronic device and the decal or an insert (e.g., an insert that consists of a rigid element) to prevent the introduction of a protective material beneath the preformed masking element, or between the preformed masking element and the electronic device to which the preformed masking element has been applied.

In other embodiments two or more types of fluid masking material may be used together. Without limitation, a non-hardenable masking material may be introduced into a receptacle of an electronic device, while a hardenable masking material may be applied over the non-hardenable masking material and over an opening of the receptacle.

Masks according to this disclosure are used to prevent adhesion of a protective coating to surfaces of the electronic device that have been covered, or masked, by the masks. Once an electronic device has been masked, a protective coating may be applied to the mask(s) and to surfaces of the electronic device that are exposed through the mask. The mask may be used in connection with the application of a variety of protective coatings, including, without limitation, protective coatings that comprise an unsubstituted poly(p-xylylene) polymer (i.e., an unsubstituted parylene), protective coatings that comprise a substituted poly(p-xylylene) polymer (i.e., a substituted parylene) and multi-layer protective coatings that have been applied by the atomic layer deposition (ALD) processes disclosed by U.S. patent application Ser. No. 14/740,193, the entire disclosure of which is hereby incorporated by reference.

Once the protective coating has been applied to the electronic device, portions of the protective coating that overlie the mask or elements of the mask may be removed, as may the mask or at least some elements thereof. In some embodiments, the electronic device may then be assembled with other electronic devices, including, but not limited to, other electronic devices to which protective coatings have been applied.

Other aspects, as well as features and advantages of various aspects, of the disclosed subject matter will become apparent to those of ordinary skill in the art through consideration of the ensuing description, the accompanying drawings and the appended claims.

DETAILED DESCRIPTION

Figure 1A:
FIGS. 1A and 1B schematically illustrate an embodiment of a flat preformed element for masking part of an electronic device, in which the flat preformed element comprises a strip, such as a length of tap.

Protective coatings are applied to an electronic device subassembly, a partially assembled electronic device or an assembled electronic device, each of which may be referred to hereinafter as an "electronic device" for the sake of simplicity, in order to provide protection to the electronic device from contaminants such as moisture, water, organic solvents, or dust. It is understood that various protective coatings may be applied. For example, protective coatings are described in U.S. Patent Application Publication 2011/0262740 of Martin et al., the entire disclosure of which is hereby incorporated by reference. When the protective coating is applied, some features or components of the electronic device are shielded when the protective coating is applied to the electronic device. These features or components may be shielded from the protective coating applying a masking material to the features or components before the protective coating is applied, and removing the masking material after the protective coating has been applied. Alternatively, a protective coating may be applied to the features or components, and then one or more portions of the protective coating may be selectively removed from the features or components. These pre-coating and/or post-coating processes may be conducted manually or with semi-automated and/or fully automated stations or systems.

The material from which the mask is formed is impervious and/or resistant to the protective material at least during the protective material application process. The edges of the mask may be sealed against the surfaces to which the mask is applied to prevent passage of the protective material onto the feature or component to be masked. In some embodiments, a mask or a portion of a mask may be formed from a fluid masking material. A fluid masking material may conform to the shape(s) of a feature and/or a component to which it is applied. In some embodiments, the fluid masking material may comprise a hardenable masking material. In other embodiments, the fluid masking material may not harden, or a "non-hardenable" masking material.

Some non-limiting embodiments of hardenable masking materials include hot melt adhesives (e.g., hot glue), solder mask materials, liquid latex, silicone, other room temperature vulcanizing (RTV) materials, UV-curable (or other radiation-curable) coating materials, thermoset material and materials that cure when exposed to moisture. A few embodiments of fluid masking materials that do not harden, or "non-hardenable" masking materials, include, but are not limited to, grease and anti-corrosive gels. Of course, a variety of other conformal coating materials (both hardenable and not hardenable) could also be used to mask one or more features of an electronic device.

A fluid masking material may be applied to selected locations of an electronic device by any suitable technique. In some embodiments, the fluid masking material may be applied manually. In other embodiments, semi-automated and/or fully automated fluid dispensing equipment may be used.

A hot melt adhesive, or a hot glue, may be applied to a variety of features and/or components of an electronic device. Without limitation, hot melt adhesives may be used to mask autofocus (AF) cameras and front-facing cameras of electronic device subassemblies or electronic device assemblies that are to be incorporated into electronic devices such as mobile telephones, tablet computers and digital media players. In some embodiments, a support may be placed behind a camera as a mask material is applied to the camera to prevent damage to the camera and/or to the substrate (e.g., the PCB) that carries the camera. If, upon applying hot glue to an AF camera, the AF camera is spaced apart from its housing, the camera may be pressed from the opposite side (e.g., of the PCB) to eliminate the spacing, as well as the likelihood that hot melt adhesive will remain between the camera and its housing, which may inhibit the autofocus functionality of the camera. Sensors that correspond to (and may be located adjacent to) a camera may also be masked with a hot melt adhesive.

Hot melt adhesives may also be used to mask ports and other receptacles of an electronic device. Since hot melt adhesives are somewhat rigid when they harden, a mask that is formed from hot melt adhesive within a receptacle or another may be formed with an element that may be grasped to facilitate removal of the mask from the receptacle.

In addition, hot melt adhesives may also be used to mask electrical connectors that include spring-type contacts (e.g., hook-type contacts). Examples of spring-type contacts include, but are not limited to, those used in button connectors, connectors for light emitting diodes (LEDs), such as those used for camera flashes, flash lights, connectors for housing-mounted antennas, and the like. In a specific embodiment, a bead of hot melt adhesive may be applied over each row of spring-type contacts, but not forced or pressed against spring-type contacts. Application of the hot melt adhesive in this manner may mask each spring-type contact of an electrical connector while enabling the spring-type contact to retain its shape and configuration.

Hot melt adhesives may also be used to mask electrical connectors with contacts that comprise spring-loaded pins, such as the contacts that are often found in SIM card slots and micro SIM card slots. When a hot melt adhesive is used to mask a contact that comprises a spring-loaded pin, the hot melt adhesive may flow into an opening in which the pin is located.

A variety of other types of contacts may also be masked with a hot melt adhesive.

Hot melt adhesives may also be used to mask the audio receiving element of a microphone.

A suitable hot melt adhesive, such as a variety of the hot glues available from Henkel AG & Co. KGaA of Dusseldorf, Germany under the TECHNOMELT® trademark. Hot melt adhesives may be applied in any suitable manner, such as by use of a hot glue gun and nozzle tip; for example, those available from Glue Machinery Corporation of Baltimore, Md. More specifically, the CHAMP 10 LCD hot glue gun and the nozzle tip sold as part number (PN) 3663, which has an inner diameter (ID) of 1.5 mm and an outer diameter of 1.8 mm, may be used to heat the hot glue to an adequate temperature (e.g., about 320° F. or about 160° C.) and to dispense the hot glue under sufficient pressure (e.g., 40 psi) to mask each intended feature and/or component.

In some embodiments, pressure may be applied to a hot melt adhesive that has been applied to a feature and/or component of an electronic device. The application of pressure to the hot melt adhesive may ensure the hot melt adhesive adheres to each feature and/or component to which it has been applied. Pressure may also be applied to a hot melt adhesive to ensure that it properly fills any recesses and/or receptacles in/of the feature and/or component. Pressure may also be applied to the hot melt adhesive to cause it to spread out over a desired area on the feature and/or component. In some embodiments, the quantity of the hot melt adhesive that is applied to the feature and/or component, the amount of pressure that is applied to the hot melt adhesive (e.g., a predetermined amount of pressure) and/or the amount of time that the pressure is applied to the hot melt adhesive (e.g., a predetermined duration of time) may be tailored to cause the hot melt adhesive to cover a particular area of the feature and/or component. Pressure may be applied to the hot melt adhesive while the hot melt adhesive is still in a somewhat fluid state. Any of a variety of suitable techniques may be used to apply pressure to a hot melt adhesive, including, without limitation, by use of a press tool, by application of pressurized air or the like.

Liquid latex and liquid, latex-based materials, including, without limitation, liquid solder masks, may also be used as fluid masking materials on electronic devices. These materials, which are collectively referred to herein as "liquid latex" materials, may be used to mask a variety of features and/or components, including, without limitation, electrically conductive contact pads (e.g., terminals, test pads, ground contacts (or ground pads)), conductive traces, spring-type contacts, conductive leads and structures (e.g., solder balls) for securing the conductive leads to corresponding electrical contacts and detect switches for ports, card slots and/or card readers.

Some non-limiting examples of liquid latex materials are materials marketed under the name CHEMASK®) by Chemtronics of Kennesaw, Ga., and the liquid materials available from Stannol GmbH of Wuppertal, Germany. Such a material may be applied manually, semi-automatedly or automatedly, and in any suitable manner. In a specific embodiment, a fluid dispenser, such as Nordson EFD (PN 7017041) dispensing system with a dispensing tip of desired size (e.g., Nordson PN 701815820 gauge tapered dispensing tip), may be used to apply a liquid latex material to selected locations on an electronic device. A liquid dispensing system may be used to apply dots of uniform size to the electronic device; for example, dots having diameters of about 1 mm to spring contacts, dots of about 2 mm diameter to contact pads Non-hardenable masking materials that are in a semisolid state are also useful for masking various features and/or components of an electronic device. Without limitation, such semisolid masking materials may include greases (e.g., synthetic grease, such as SUPER LUBE® synthetic multi-purpose grease, available from Synco Chemical Corporation of Bohemia, N.Y.) and gels (e.g., anti-corrosion gels). Non-hardenable semisolid masking materials may be applied to a variety of different types of electrical connectors, including, but not limited to, contacts of a battery connector and plug-in type electrical connectors and zero insertion force (ZIF) connectors (e.g., ZIF connectors for headphone jack cables, ZIF connectors for connecting cameras, ZIF connectors for connecting displays to mother boards, other board-to-board (B2B) connectors).

A non-hardenable semisolid masking material may also be used to mask moveable, housed components. In a specific embodiment, the non-hardenable semisolid masking material may be placed in the housing before the housing and the AF camera is initially assembled with the housing (i.e., by the manufacturer of the AF camera) and, thus, before the AF camera and its housing are assembled with a printed circuit board and/or incorporated into a finished electronic device. In another specific embodiment, an AF camera may be removed from its housing, a non-hardenable semisolid masking material (e.g., a synthetic grease of an anti-corrosive gel) may be introduced into the housing, and then the AF camera may be placed back into the housing.

When non-hardenable semisolid masking materials are used to mask an electrical connector, electrical connections may be established through the non-hardenable semisolid masking material before application of a protective coating. Without limitation, mating elements may engage one another (e.g., a plug may be inserted into a receptacle, a ZIF connector may be coupled to conductive elements and closed, a card may be introduced into a slot) prior to application of a protective material. After a protective coating is applied over the electrical connector, the non-hardenable semisolid masking material may be remain in place.

Non-hardenable semisolid masking materials may also be applied to components with moving parts, such as components that are configured to induce vibration in electronic devices that are in so-called "silent mode." Again, the non-hardenable semisolid masking material may remain in place over movable components once a protective coating has been applied to an electronic device.

Other fluid masking materials may be used to form seals. Without limitation, room temperature vulcanizing (RTV) materials (e.g., RTV silicones) may be used to form seals that will prevent protective coating materials from accessing certain locations within an electronic device. For example, an RTV silicone may be used to seal any gaps at a junction between the housing for a vibration-inducing motor and a PCB of an electronic device. As another example, an RTV silicone may be used to form a seal between each camera and its housing. The formation of such a seal may comprise use of a syringe or another suitable tool to form a bead having a width or a diameter of about 0.5 mm, about 1 mm, about 2 mm The RTV material may be allowed to cure sufficiently or completely before a protective coating is applied to the electronic device.

Liquid materials that cure when exposed to an appropriate wavelength of electromagnetic radiation (e.g., UV curable materials or other radiation curable materials) may also be used to form seals in electronic devices.

A seal that has been formed to prevent the application of a protective coating to one or more features of an electronic device may remain in place after the protective coating has been applied to the electronic device and, thus, the seal may remain in the finished electronic device.

Flat preformed elements 10, 20, embodiments of which are depicted by FIGS. 1A, 1B, 2A and 2B, may be applied to some features and/or components of an electronic device. Flat preformed elements 10, 20 may be used to mask relatively flat features of an electronic device, such as terminals or other conductive contacts (e.g., test contacts) on the surface of a PCB, conductive traces on the PCB, microphones (which may be reconnected (e.g., to the PCB) once it has been masked) and the like. Some non-limiting examples of such flat preformed elements 10, 20 include strips of tape 10, die-cut decals 20 or stickers (including custom-cut decals or stickers), masking films and the like. A flat-preformed element 10, 20 may comprise a suitable material, such as paper or a paper-like material, a fabric, a polymeric film or the like.

Figure 2A:
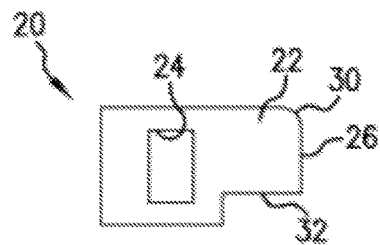
FIGS. 2A and 2B schematically depict another embodiment of a flat preformed element for masking part of an electronic device, in which the flat preformed element comprises a pre-cut decal or sticker.
Figure 1B:
Figure 2B:

In some embodiments, a flat preformed element 10, 20 may include an adhesively coated bottom surface 11, 21 (FIGS. 1B and 2B, respectively). Among a variety of suitable adhesive materials are pressure-sensitive adhesives and curable adhesives.

Alternatively, flat preformed elements 10, 20 may lack an adhesive coating, and may be secured to an electronic device by application of an adhesive material to the flat preformed element 10, 20 and/or to the electronic device. As another option, a flat preformed element 10, 20 may be non-adhesively secured to a surface of the electronic device (e.g., electrostatically).

An embodiment of a strip 10 is illustrated by FIGS. 1A and 1B. The strip 10 comprises an elongated element 12 with a relatively narrow width. The length of the elongated element may be configured to enable the strip 10 to extend a predetermined distance across a surface of an electronic device. A width of the strip 10 may enable the strip 10 to fit between certain structures (e.g. protruding components) on the surface of the electronic device.

FIGS. 2A and 2B illustrate an embodiment of a decal 20 that has been cut to a predetermined shape. A decal 20 may be formed to a desired shape. The decal 20 may be pre-cut (e.g., die-cut) to the desired shape. The desired shape may comprise a predetermined shape that corresponds to a shape of a feature, a component or a collection of features and/or components of an electronic device that is to be masked.

In the illustrated embodiment, the decal 20 includes a solid element 22 with an internal aperture 24 defined therethrough. The internal aperture 24 is configured and located to expose one or more features and/or components of an electronic device as the decal 20 is properly positioned on the electronic device. With the one or more features and/or components exposed through the decal 20, a protective coating may be applied to that/those features and/or components. In addition, an outer periphery 26 of the decal 20 may have a shape that enables the decal 20 to cover desired features and/or components of the electronic device, while accommodating other features and/or components of the electronic device. In this regard, the decal 20 includes a rounded corner 30 that enables the decal 20 to be positioned adjacent to a rounded corner of a PCB of the electronic device. In addition, the decal 20 includes a notch 32 that is configured to accommodate a raised component that protrudes from the PCB.

Flat preformed elements, such as strips 10 of tape, decals 20 or the like may be placed on an electronic device in any suitable manner. Without limitation, a flat preformed element may be placed on an electronic device manually or with automated equipment (e.g., with pick and place equipment, by a multi-axis robot). Once a flat preformed element is properly placed, or while the flat preformed element is placed, pressure may be applied to the flat preformed element to ensure that the flat preformed element is secured in place to a surface of the electronic device (e.g., by way of an adhesive material on a bottom surface of the flat preformed element, by way of an adhesive material that was previously applied to the surface of the electronic device, as a securing element (e.g., an adhesive material, a fluid masking material) is applied around an outer periphery of the flat preformed element).

Figure 3A:
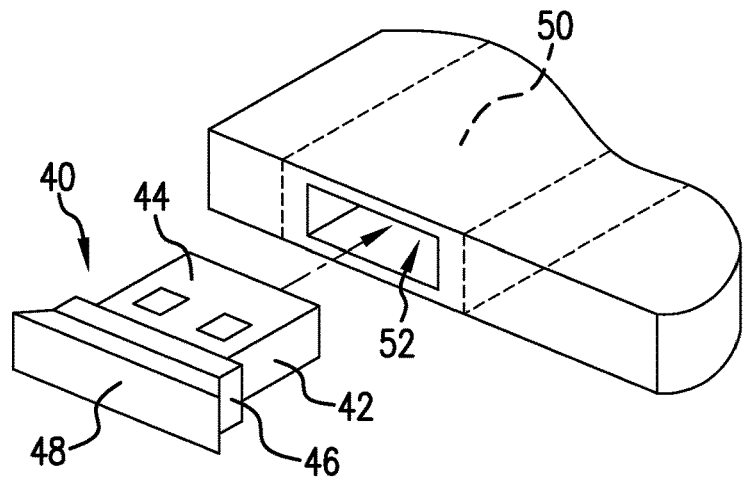
FIGS. 3A-3C provide a schematic representation of an insert for masking a receptacle or recess of an electronic device, with FIG. 3A illustrating introduction of the insert into the receptacle or recess, FIG. 3B showing an assembled relationship of the insert and the receptacle or recess and FIG. 3C providing a cross-sectional representation of the insert within the receptacle or recess in the assembled relationship in accordance with embodiments of the disclosed subject matter.
Figure 3B:
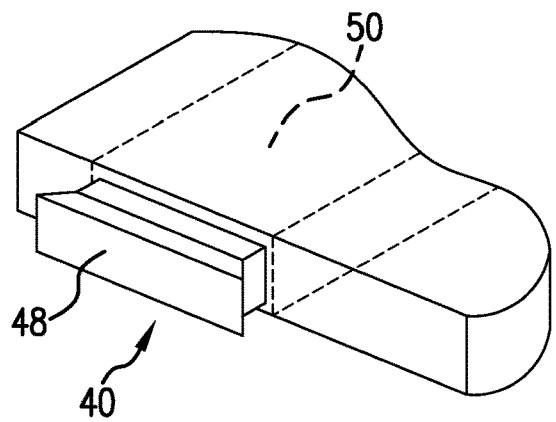
Figure 3C:
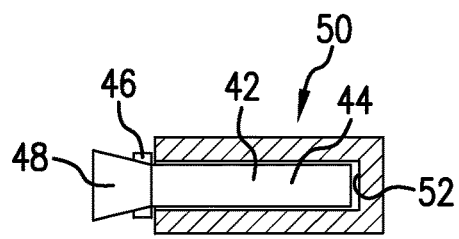

Turning now to FIGS. 3A-3C, a preformed structure, which is referred to herein as an insert 40 and may also be referred to as a "plug," may be used to mask some features and/or components of an electronic device. An insert 40 may include a masking element 42 that is configured to be inserted into a receptacle 52 or another recess of a component 50 of the electronic device. In some specific embodiments, the insert 40 may comprise a non-functional replica of the card the card slot is configured to receive, or a "dummy," card (e.g., a dummy micro-SD card, a dummy SD card, or a dummy SIM card). The insert 40 may also include a manipulation element 48 that enables insertion of the masking element 42 into the receptacle 52, as well as removal of the masking element 42 from the receptacle 52. In the embodiment illustrated by FIG. 3B, the masking element 42 may be configured to be received by a USB port of an electronic device and, while the masking element 42 resides within the receptacle 52, the manipulation element 48 may protrude from the electronic device. Other embodiments of inserts 40 include inserts, plugs or dummy cards that are configured to be received by other communication ports and/or charge ports (e.g., mini USB ports, micro USB ports, LIGHTNING ports, THUNDERBOLT ports, or HDMI ports), card receptacles (e.g., SIM card receptacles or SD card slots), openings for microphones and/or a speakers, headphone jacks, RCA jacks, and the like.

In some embodiments, an insert 40 may consist of a rigid element. Alternatively, as illustrated by FIG. 3C, a masking element 42 of an insert 40 may comprise a rigid element 44, as well as a seal 46. More specifically, the rigid element 44, which may facilitate insertion of the masking element 42 of the insert 40 into a receptacle 52 and, optionally, its removal from the receptacle 52, may comprise a central part of the masking element 42. The seal 46 may be positioned to prevent the introduction of a protective coating material into the receptacle 52, at locations between the surfaces of the masking element 42 and opposed surfaces of the receptacle 52. In some embodiments, the seal 46 may comprise a compressible, resilient element formed on the rigid element 44 from a material that will seal against surfaces of the receptacle 52 and prevent a protective coating material from being introduced into the receptacle 52. Such a seal 46 may comprise a permanent part of the insert 40, or it may be applied to the masking element 42 of the insert 40 in a manner that enables subsequent removal and replacement (e.g., as an adhesive-coated element, such as a polyimide tape). In other embodiments, the seal 46 may be formed with a fluid masking material to the rigid element 44; for example, by applying the fluid masking material to the rigid element 44 before the rigid element 44 is introduced into the receptacle 52, by applying the fluid masking material to the receptacle 52 before the rigid element 44 is introduced into the receptacle or by applying the fluid masking material to one or both of the rigid element 44 and the receptacle 52 after the rigid element 44 has been at least partially introduced into the receptacle 52.

Figure 4A:
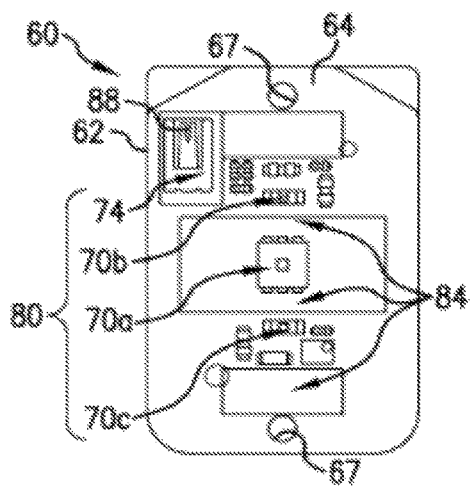
FIGS. 4A and 4B show opposite sides of an electronic device; more specifically, an electronic subassembly, as well as various features and/or components that may be masked by different processes in accordance with embodiments of the disclosed subject matter.
Figure 4B:
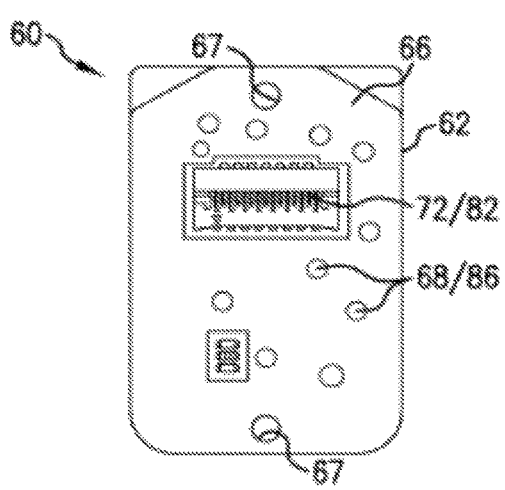

A variety of different masking techniques, including, but not limited to, any of the foregoing, may be used in conjunction with one another to prevent application of a protective coating to various features and/or components of an electronic device. FIGS. 4A and 4B illustrate an embodiment of a combination of different masking processes that may be used to prevent application of a protective coating material and, thus, a protective coating to selected features and/or components of an electronic device 60.

FIG. 4A and FIG. 4B show opposite sides of the electronic device 60—more specifically, of an electronic device subassembly. An electronic device subassembly may be a motherboard, a daughter board, or a flexible printed circuit connector, etc. The electronic device 60 shown in FIGS. 4A and 4B includes a PCB 62 with a first surface 64 and a second surface 66 opposite from the first surface 64. Apertures 67 extend through a thickness of the PCB 62. Contact pads 68 are carried by one or both of the first surface 64 and the second surface 66, as are various components 70a, 70b, electrical connectors 72 and the like. In some embodiments, the electronic device 60 may also include a receptacle 74, such as a card slot, a communication and/or power port or the like.

In the specific embodiment depicted by FIGS. 4A and 4B, a hot melt adhesive may be used to mask the features and/or components at locations 80 of the electronic device 60, which may include components that protrude from the electronic device 60 (e.g., packaged semiconductor devices; electronic components, such as resistors or capacitors). A non-hardenable semisolid masking material may be applied to location 82, which may comprise at least part of an electrical connector 72. Strips 10 (FIGS. 1A and 1B) may be applied to locations 84 on a surface 64, 66 of the electronic device 10 to enable the subsequent assembly of other components with the PCB 62 (e.g., with adhesive materials, other bonding processes). Decals 20 (FIGS. 2A and 2B) may be applied at locations 86, which represent contact pads 68 of the PCB 62. An insert 40 (FIGS. 3A-3C) may be assembled with the receptacle 74 at location 88.

In some embodiments, two or more different masking processes may be used to mask a feature and/or a component of an electronic device. For example, a hot melt adhesive or a liquid latex may be used to provide a temporary seal around portions of an insert 40 (FIGS. 3A-3C) within the receptacle 74 at location 88 of the electronic device 60, as shown in FIG. 4A. As another example, in addition to applying a non-hardenable semisolid masking material to the contacts of the electrical connector shown at location 82 of FIG. 4B, a hot melt adhesive may be applied over the non-hardenable semisolid masking material. In some embodiments, the second mask material may be pressed into openings of the connector.

With a mask in place, a device may be coated. Various processes may be used to coat the device. Without limitation, the protective coating may comprise one of the protective coatings applied by HZO, Inc., of Draper, Utah. In various embodiments, such a coating may comprise a parylene material (i.e., an unsubstituted or substituted poly (p-xylylene)) or a multi-layer structure comprising thin films of ceramic materials that have been deposited by atomic layer deposition (ALD) processes.

Once a coating has been applied to a device, the masking material and/or one or more portions of the protective material may be removed. In some embodiments, locations of a protective coating that overlie the outer periphery of a mask or locations outside of the outer periphery of the mask may be cut, scored, otherwise weakened or removed to facilitate removal of the mask without damaging portions of the protective coating that are to remain on the electronic device. Removal of the masking material and/or the protective material may be manual, semi-automated or fully automated.

Figure 5A:
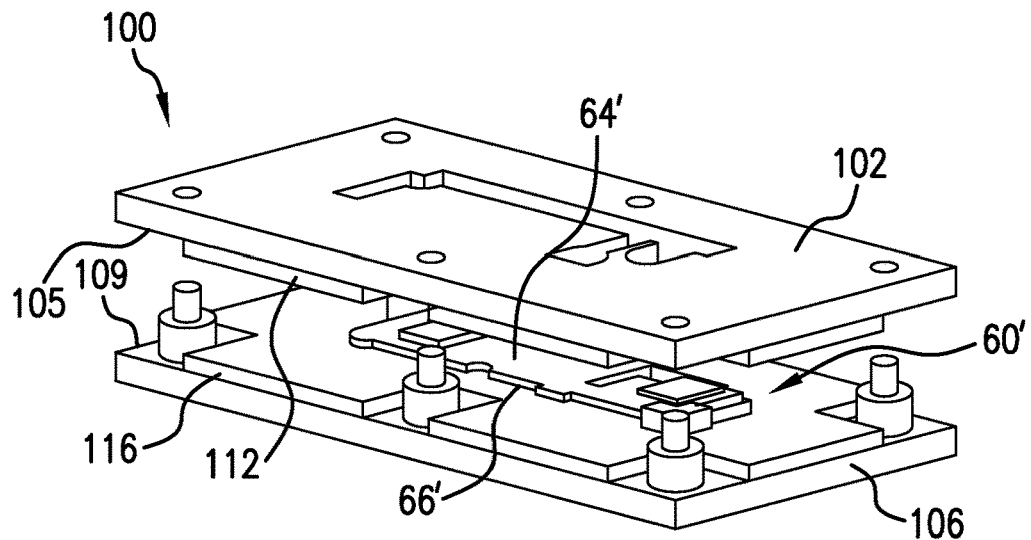
FIGS. 5A-5C illustrate templates for use in removing a protective coating from selected areas of an electronic device in accordance with an embodiment of the disclosed subject matter.
Figure 5B:
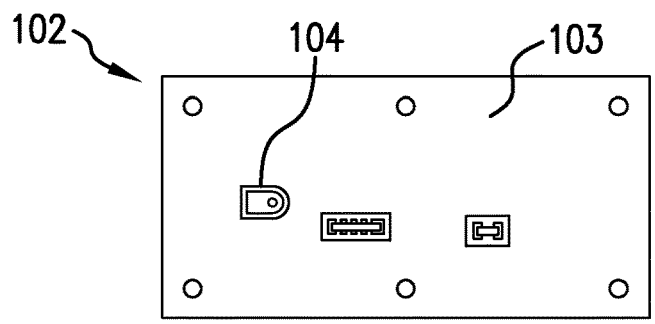
Figure 5C:
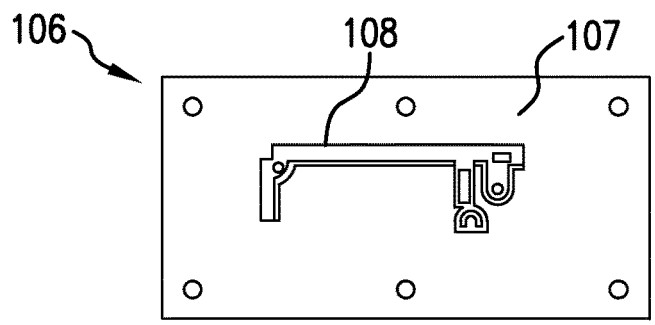

One embodiment of a process for removing protective material and/or masking material is use of dry ice blasting or an abrasive technique. The dry ice blasting process leaves no secondary waste material, is non-toxic and is completely dry. HZO, Inc.,has created specialty cleaning templates which target key areas requiring coating removal. An embodiment of a template assembly 100 that may be used in dry ice blasting is depicted in FIGS. 5A-5C. As shown by FIG. 5A, the template assembly 100 includes a first template 102 configured for assembly over a first side 64' of an electronic device 60' (e.g., an electronic subassembly) and a second template 106 configured to be assembled over a second side 66' of the electronic device 60'. FIGS. 5B and 5C respectively show view of the outer surfaces 103 and 107 of the templates 102 and 106, which include apertures 104 and 108 that are configured to be positioned over parts of a protective coating that are to be removed from the electronic device 60'. The inner surfaces 105 and 109 of the templates 102 and 106 are respectively configured to be placed against the first side 64' and the second side 66' of the electronic device 60', and may be at least partially lined with a foam material 112 and 116 (e.g., polystyrene foam or polyurethane foam), which may seal against the electronic device 60', prevent movement of the electronic device 60' relative to the template 62, 66 and/or prevent damage to the electronic device 60' or to a protective coating on the electronic device 60'.

Of course, a variety of other material removal techniques may be used to facilitate the removal of selected portions of a protective coating from an electronic device. A few embodiments of such processes include the use of an abrasive material in place of dry ice, the use of lasers and the use of cutting dies.

Once selected portions of a mask and/or a protective coating have been removed from an electronic device (in some embodiments, non-hardenable semisolid masking materials may remain in place), the electronic device may be coupled to and/or assembled with other components (e.g., other electronic devices or housing components). In embodiments where the electronic device is to be electrically coupled to another electronic device, once selected portions of a mask and/or protective coating have been from complementary electrical connectors of the electronic devices, the complementary electrical connectors may be coupled to one another. Optionally, a conformal coating (e.g., a hot melt adhesive, a urethane, an acrylate or a silicon) may be applied to the mated electrical connectors to provide a sealed connection.

Further details regarding various masking techniques, uses of different masking techniques in combination and other aspects of the disclosed subject matter will become apparent from the examples that follow.

The procedures disclosed in each EXAMPLE that follows were developed for use in applying a protective coating to various electronic subassemblies.

EXAMPLE 1

Masking
Printed Circuit Board

A variety of techniques may be used to mask features or components of a printed circuit board (PCB) of a mobile telephone.

As an example, a vibration component of a mobile telephone may be masked and/or sealed with a suitable conformal masking material (e.g., silicone, another room temperature vulcanizing (RTV) material, a radiation-curable conformal coating material, another conformal coating material). In a specific embodiment, silicone may be dispensed from a syringe to form a bead around an edge of the vibration motor. Such a bead may have a thickness of about 1 mm. The silicone may then be permitted to cure before the mobile telephone is subjected to protective coating processes.

Any ports of the mobile telephone may also be sealed. In some embodiments, a plug that is configured to fit into the port (e.g., a micro USB port, a SIM or micro SIM card slot, a proprietary port) may be used to seal a port of a mobile telephone. Such a plug may be coated with a material that will seal against surfaces within the port (e.g., the surfaces of contacts within the port). In some embodiments, the plug may be pre-coated with a compressible, resilient material. In other embodiments, a compressible, resilient material (e.g., in the form of a strip, a decal) may be applied to the plug. With the coating in place on the plug, the plug may be inserted into a complementary port to seal the port and, thus, to mask the port in a manner that will prevent application of a material of a protective coating to contacts within the port.

Some embodiments of ports may be masked by filling them with a suitable fluid masking material, such as a hot melt adhesive, a liquid latex material or any other material that will seal the contacts within the ports and which, after hardening or curing, may be pulled from the port.

Microphones of the mobile telephone may also be masked in any suitable manner. Masking of a microphone may also include masking of any elements that electrically connect the microphone to other components of the mobile telephone, such as flexible printed circuit (FPC) connector. Such a connector may be disconnected (e.g., from the PCB) prior to application of a mask to the microphone or the FPC connector. Each microphone connected to or carried by the FPC connector may then be masked. Masking may include application of a hot melt adhesive, or hot glue, in any suitable manner. In a specific embodiment a hot glue gun with a suitable nozzle may be used to heat the hot glue to an adequate temperature (e.g., about 320° F. or about 160° C.) and dispense the hot glue under sufficient pressure (e.g., 40 psi) to mask each microphone. In some embodiments, a hot glue press tool may be used to ensure that the hot glue adheres to the microphone and any adjacent structures, as desired. Electrical contacts of the connector (e.g., ground contacts (or ground pads)) may also be masked; for example, with an adhesive coated element, such as a tape. Once the microphone has been masked, it (or its connector) may be reconnected (e.g., to the PCB).

Foam may be removed from certain locations of the PCB of the mobile telephone (e.g., sensors), and the adhesion areas from which the foam was removed may be masked. Hot glue and appropriate tools for forming a mask from hot glue (e.g., those disclosed in the preceding paragraph) may be used for this purpose.

Hot glue and corresponding tools may also be used to mask an AF camera of the mobile telephone and/or a front-facing camera of the mobile telephone. In some embodiments, a support may be placed behind a camera as a mask material is applied to the camera to prevent damage to the camera and/or to the substrate (e.g., the PCB) by which the camera is carried. If, upon applying hot glue to the camera of a mobile telephone, the camera is spaced apart from its housing, the camera may be pressed from the opposite side (e.g., of the PCB) to eliminate the spacing. Sensors that correspond to (and may be located adjacent to) a camera may also be masked with hot glue.

Connectors that include spring-type contacts (e.g., hook-type contacts) may also be masked with hot glue. Examples of this type of connector include a button connector, an electrical connector for an LED (which may be used, e.g., as a camera flash, a flashlight) and the like. In a specific embodiment, a bead of hot glue may be applied over each row of contacts of the electrical connector, but not pressed against the contacts, which may mask each contact of the electrical connector while enabling that contact to retain its shape and configuration. In some embodiments, some structures, such as spring-type contacts, may be masked with a liquid latex instead of with hot glue.

Various contacts may also be masked with hot glue. As a non-limiting example, hot glue may be used to mask contacts for a SIM card or a micro SIM card. In embodiments where such a contact includes spring-loaded pins, the hot glue may also flow into the openings in which the pins are located. Alternatively, an insert, or a "SIM blank," could be inserted a SIM card slot or socket to mask the contacts of the SIM card slot or socket.

Once high temperature masking processes are complete, lower temperature masking processes may be conducted.

Some contacts on the PCB of the mobile telephone may be masked with another material, such as a liquid latex. A liquid latex may be used to mask spring-type contacts (e.g., with dots having diameters of about 1 mm), as well as contact pads (e.g., with dots having diameters of about 2 mm) and ground contacts, or ground pads (e.g., by covering the same (as the ground contacts may have any of a variety of different sizes)).

A non-hardenable semisolid masking material, such as an anti-corrosion gel or a synthetic grease, may also be used to mask at least some contacts on a PCB of a mobile telephone. Without limitation, an anti-corrosion gel may be applied to contacts of a battery connector. In applying an anti-corrosion gel to the contacts of a battery connector, the battery connector may be opened, the anti-corrosion gel may be introduced into the battery connector, and the battery connector may be closed. Anti-corrosion gel may also be applied electrical connectors for cameras, ZIF connectors (e.g., a headphone ZIF connector, a display ZIF connector, a B2B connector), other electrical connectors that may be opened and then closed before a protective coating is applied to the PCB, plug-in type electrical connectors and other components of the mobile telephone.

Gaps may be sealed with a suitable material. In a specific embodiment, gaps between each camera and its housing may be filled with a conformal, fluid masking material (e.g., silicone, another RTV material, a radiation-curable conformal coating material, another conformal coating material) (e.g., a bead having a width of about 0.5 mm, about 1 mm to about 2 mm).

Display

Various techniques may also be used to mask features or components of a display of the mobile telephone.

If a protective screen cover is in place on the screen of the display of the mobile telephone, the protective screen cover may be removed from the screen. A masking film that will adequately mask the screen as a protective coating is applied to various parts of the mobile telephone and that will withstand the process of applying the protective coating may be applied to the screen. In a specific embodiment, the masking film may comprise an adhesive-coated polyethylene film, such as the polyvinyl chloride (PVC) adhesive-coated tape available from Orafol Americas Inc. of Black Creek, Ga., as ORAGUARD® 210 or the polyethylene adhesive-coated tape available from the 3M Company of St. Paul, Minn., as 2E9C7 polyethylene protective tape. When the masking film is positioned on the screen, bubbles (e.g., air bubbles, air pockets) may be removed from between the masking film and the screen, and the masking film may be secured to the screen. In a specific embodiment, a squeegee or a similar securing element may be used to accomplish either or both of these tasks.

Hot glue and appropriate tools may be used to mask a variety of features on the display, including, without limitation, a grounding area for a camera of the mobile telephone, display panel windows (e.g., a sensor window, a camera window, a receiver opening, a microphone opening), headphone jack pads, ZIF connectors (e.g., for a FPC cable that connects buttons to the display) and the like.

In addition, at least some of the contacts on the display may be masked with a liquid latex, including, without limitation, contact pads and ground contacts (or ground pads).

In some embodiments, the display may be connected to the PCB after masking, but prior to application of a protective coating to these parts of the mobile telephone. In addition, measures may be taken to ensure that various features of these parts are not inadvertently masked. As an example, FPC elements (e.g., an audio cable, a cable for buttons) may be removed and/or properly positioned, and the PCB and display may be oriented in a manner that will enable application of a protective coating to desired locations of these parts (e.g., the PCB may be inclined and supported at an angle of about 45° to about 90° to the display).

Coating

With the PCB and display subassemblies masked, a protective coating may be applied to the subassemblies to form a protective coating on exposed portions thereof, and on the masks.

De-Masking

Once a protective coating has been applied to the PCB-display assembly, various masks may be removed from the PCB and the display. In some embodiments, de-masking may occur while the PCB and the display remain electrically connected to one another, which may preserve a protective coating present over an electrical connector between these two parts.

Masks that were formed from hot glue or a liquid latex may be pulled from their respective features and/or components. Removal of such masks may be accomplished by grasping the masks and pulling them from their respective features or components (e.g., with tweezers or similar devices). In some embodiments, removal of such a mask may also include cutting the mask and/or locations of the protective coating adjacent to the mask. Additionally, the part(s) or component(s) from which such masks are removed may be held in place or otherwise supported during the removal process to prevent damage to the part(s) or component(s).

Upon de-masking electrical connectors, the electrical connectors may be reconnected to their complementary electrical connectors (e.g., ZIF connectors and FPC cables). Additional assembly of the mobile phone may also be conducted.

Masks that were formed from a non-hardenable semisolid masking material (e.g., an anti-corrosive gel, synthetic grease) may remain in place. Masks that comprise seals may also remain in place. Without limitation, a seal formed on a vibration component of a mobile telephone may remain in place while other features and/or components are de-masked.

Plugs may also be removed from ports. Masks formed from a liquid latex may also be mechanically removed (e.g., by cutting, peeling).

The masking film may also be removed from the screen of the display. Removal of the masking film may include cutting through a protective coating at locations adjacent to the masking film, and then peeling the masking film away from the screen.

EXAMPLE 2

Masking
Display

Various techniques may also be used to mask features or components of a display of the mobile telephone.

If a protective screen cover is in place on the screen of the display of the mobile telephone, the protective screen cover may be removed from the screen. A masking film that will adequately mask the screen as a protective coating is applied to various parts of the mobile telephone and that will withstand the process of applying the protective coating may be applied to the screen. In a specific embodiment, the masking film may comprise an adhesive-coated polyethylene film, such as a polyvinyl chloride (PVC) film marketed under the ORAGUARD trademark. When the masking film is positioned on the screen, bubbles may be removed from between the masking film and the screen, and the masking film may be secured to the screen. In a specific embodiment, a squeegee or a similar securing element may be used to accomplish either or both of these tasks.

Hot glue and appropriate tools may be used to mask a variety of features on the display, including, without limitation, around edges of the screen, in the ear piece (i.e., speaker hole), in the receiver, in each microphone hole and in the camera hole.

In addition, a first mask material (e.g., a liquid latex, an anti-corrosive gel, a synthetic grease, may be introduced into each electrical connector of the display (e.g., a B2B connector that enables connection of the display to the PCB of the mobile telephone). A second mask material, such as hot glue, may then be applied to the electrical connector, over the first mask material. In some embodiments, the second mask material may be pressed into openings of the electrical connector.

Printed Circuit Board—Display Side

A display side of the PCB of the mobile telephone may also be masked.

A liquid masking material, such as a liquid latex, may be applied to (e.g., dispensed onto) contacts and/or receiver pads on the display side of a PCB of a mobile telephone. Without limitation, a liquid latex may be dispensed using a fluid dispenser with a 20 gauge tip or another tip of useful size.

In some embodiments, receptacles (e.g., communication and/or power ports, card slots, card readers) may be masked with inserts. An insert may be prepared for insertion into a complementary receptacle of a receptacle by applying a compressible, resilient material (e.g., an adhesive-coated element, such as a polyimide tape; etc.) to locations of the insert that will be positioned adjacent to contacts of the port, slot or card reader when the insert is positioned within the receptacle of the port, slot or card reader. In addition, a liquid masking material, such as an anti-corrosive gel or a liquid latex, may be applied to a detect switch, if any, of the port, slot or card reader.

An adhesive-coated element may be secured in place on a microphone carried by the display side of the PCB.

In masking an AF camera on the display side of the PCB, the AF camera may first be disconnected. A non-hardenable semisolid masking material (e.g., an anti-corrosive gel, a synthetic grease) may then be applied to an electrical connector for the AF camera. The AF camera may then be reconnected to the electrical connector. Thereafter, a fluid masking material, such as hot glue, may be applied to the AF camera. A fluid masking material, such as hot glue, or a flat preformed element (e.g., a strip, a decal) may also be applied to a front-facing camera carried by the display side of the PCB.

Printed Circuit Board—Housing Side

Similar techniques may be used to mask features and/or components on the side of a PCB of a mobile telephone that is to be positioned adjacent to a member of the housing of the mobile telephone (e.g., a rear portion of the housing).

In a specific embodiment, contacts on the housing side of the PCB may be masked with a fluid masking material, such as a liquid latex. Electrical connectors (e.g., B2B connectors) may be coated with a protectant, such as an anti-corrosive gel, a liquid latex). A fluid masking material, such as hot glue, may also be applied to electrical connectors (e.g., B2B connectors), radiofrequency (RF) connectors and/or to battery and/or button connectors on the housing side of the PCB. A microphone (e.g., a reference microphone) carried by the housing side of the PCB may be masked by applying a flat preformed element (e.g., a strip, a decal) thereto.

Hands-Free Speaker (IHF)

A hands-free speaker (IHF) of the mobile telephone may also be masked. Masking of the IHF may include application of adhesive-coated elements to microphones of the IHF, introduction of hot glue or an insert into receptacles (e.g., communication and/or power ports, card slots, or card readers) of the IHF, application of a fluid masking material, such as liquid latex, to contacts of the IHF, application of a protectant and hot glue (in sequence) to an electrical connector (e.g., an FPC connector, a ZIF connector) of the IHF and application of hot glue to radiofrequency (RF) cables of the IHF.

Coating

With the display, PCB and IHF subassemblies masked, a protective coating may be applied to each of these subassemblies to form a protective coating on exposed portions thereof, and on the masks.

De-Masking

Once a protective coating has been applied to the display, the PCB and the IHF, various masks may be removed from these sub-assemblies.

The display of the mobile telephone may be de-masked by removing the hot glue from around the edges of the screen and by removing masks that were formed from hot glue from various features of the display (e.g., from the ear piece (i.e., speaker hole), from the receiver, from each microphone hole, or from the camera hole).

The masking film may also be removed from the screen.

Masks may also be removed from each connector of the display (e.g., each B2B connector).

Masks that were formed from hot glue, a liquid latex or similar materials, as well as masking films, may be peeled or otherwise pulled from their respective features and/or components. Removal of such masks may be accomplished by grasping the masks and pulling them from their respective features or components (e.g., with tweezers or similar devices). In some embodiments, removal of such a mask may also include cutting the mask and/or locations of the protective coating adjacent to the mask. Additionally, the part(s) or component(s) from which such masks are removed may be held in place or otherwise supported during the removal process to prevent damage to the part(s) or component(s).

Masks formed from non-hardenable semisolid masking materials (e.g., synthetic grease or anti-corrosion gel) may remain in place, or they may be cleaned from the features and/or parts on which these materials were used.

Upon de-masking electrical connectors, the electrical connectors may be reconnected to their complementary connectors (e.g., ZIF connectors and FPC cables). Additional assembly of the mobile phone may also be conducted.

EXAMPLE 3

Masking

Another embodiment of mobile telephone was masked by applying a masking film to its entire screen, with peripheral portions of the masking film located laterally beyond peripheral edges of the screen. Hot glue was applied around the outer periphery of the display and to a back (e.g., adhesive-coated) side of the peripheral portions of the masking film. A male electrical connector of the display was masked by applying a strip of synthetic grease to contacts of the electrical connector (although other non-hardenable semi-solid masking materials could also be used), and then applying hot glue over the synthetic grease. Pressure was applied to the hot glue to ensure that the mask formed thereby was secured in place on the connector.

Inserts were introduced into corresponding card slots, or sockets, of the mobile telephone. In addition, the detect switch of each card slot was masked (e.g., by introducing synthetic grease into the detect switch).

Battery contact pins on the PCB of the mobile telephone were protected with a fluid masking material (e.g., hot glue, liquid latex), as were ground contacts (or ground pads), buttons (e.g., a power button, volume buttons), female connectors, communication ports and microphones on the PCB and the contacts on the battery.

A fluid masking material was also used to form a mask on an AF camera of the mobile telephone. Once the AF camera was masked, it was electrically connected (with suitable connectors) to the PCB.

Coating

With the subassemblies of the mobile telephone masked, a protective coating may be applied to each subassembly to form a protective coating on exposed portions that subassembly, and on the masks.

De-Masking

The screen of the display unit of the mobile telephone was de-masked by pulling the previously hardened and/or cured hot glue away from the periphery of the display, and then peeling the masking film away from the screen. The mask over the contacts of the male connector of the display was also removed by pulling the mask off of the contacts.

The protective coating may be cut at locations that surround masks over contacts of the display. With the protective coating cut, the masks and portions of the protective coating thereover may be removed from the contacts of the display. Masks that were formed over contacts of the PCB may be removed from the contacts in the same manner.

Masks may also be pulled out of communication ports and female connectors and off of microphones, cameras and other components or features.

Inserts and/or cards may be removed from their corresponding sockets, or slots, and any additional masking materials (e.g., synthetic grease) may be cleaned from the sockets. Contacts within the sockets may be inspected to ensure that they are not covered with the protective coating and, if they are, the protective coating may be removed therefrom (e.g., by way of dry ice blasting).

EXAMPLE 4

Figure 6A:
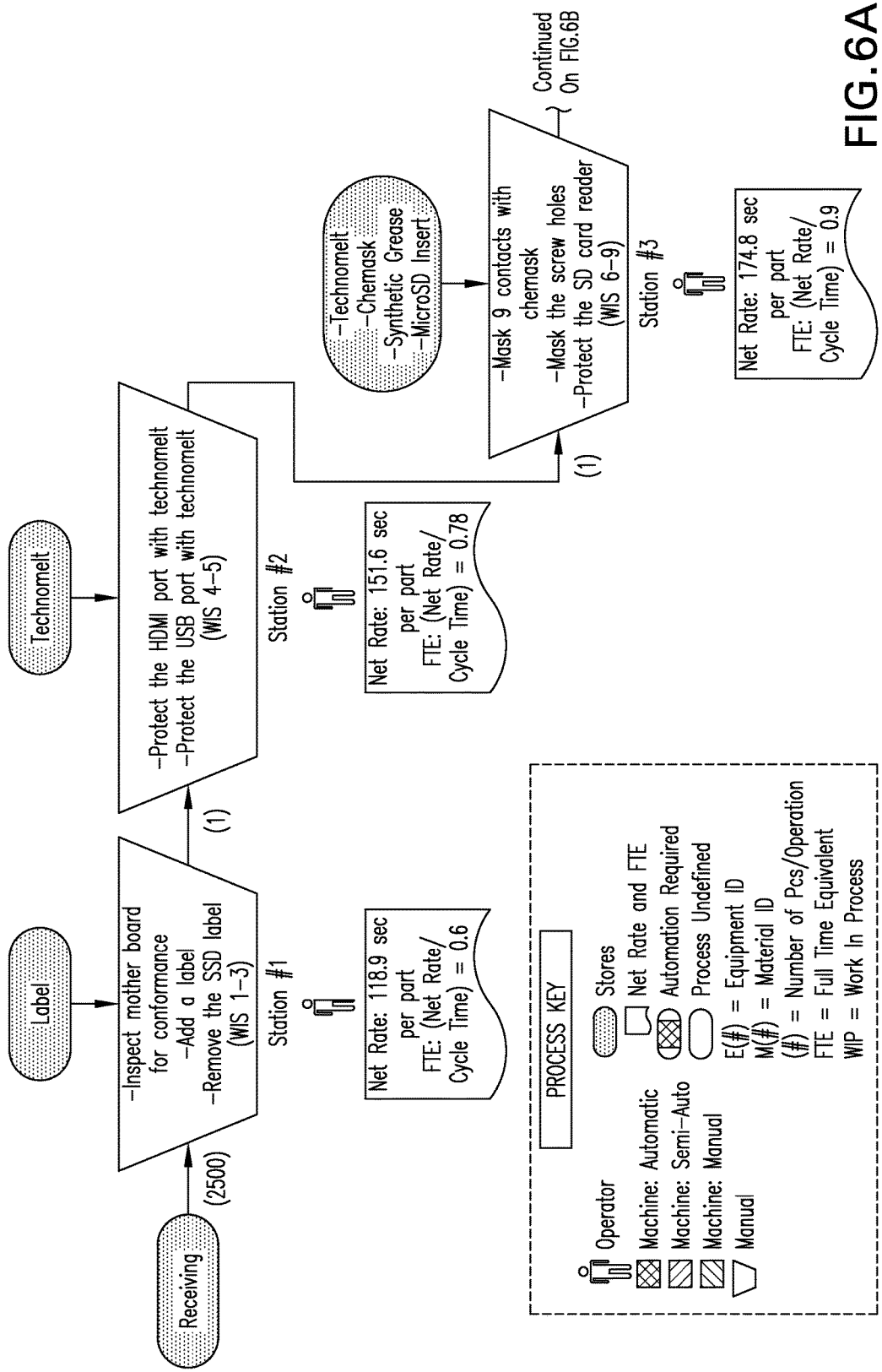
FIGS. 6A-C, 7A-D, 8 are flow diagrams illustrating processes for masking, coating and de-masking various embodiments of electronic devices in accordance with an embodiment of the disclosed subject matter.
Figure 6B:
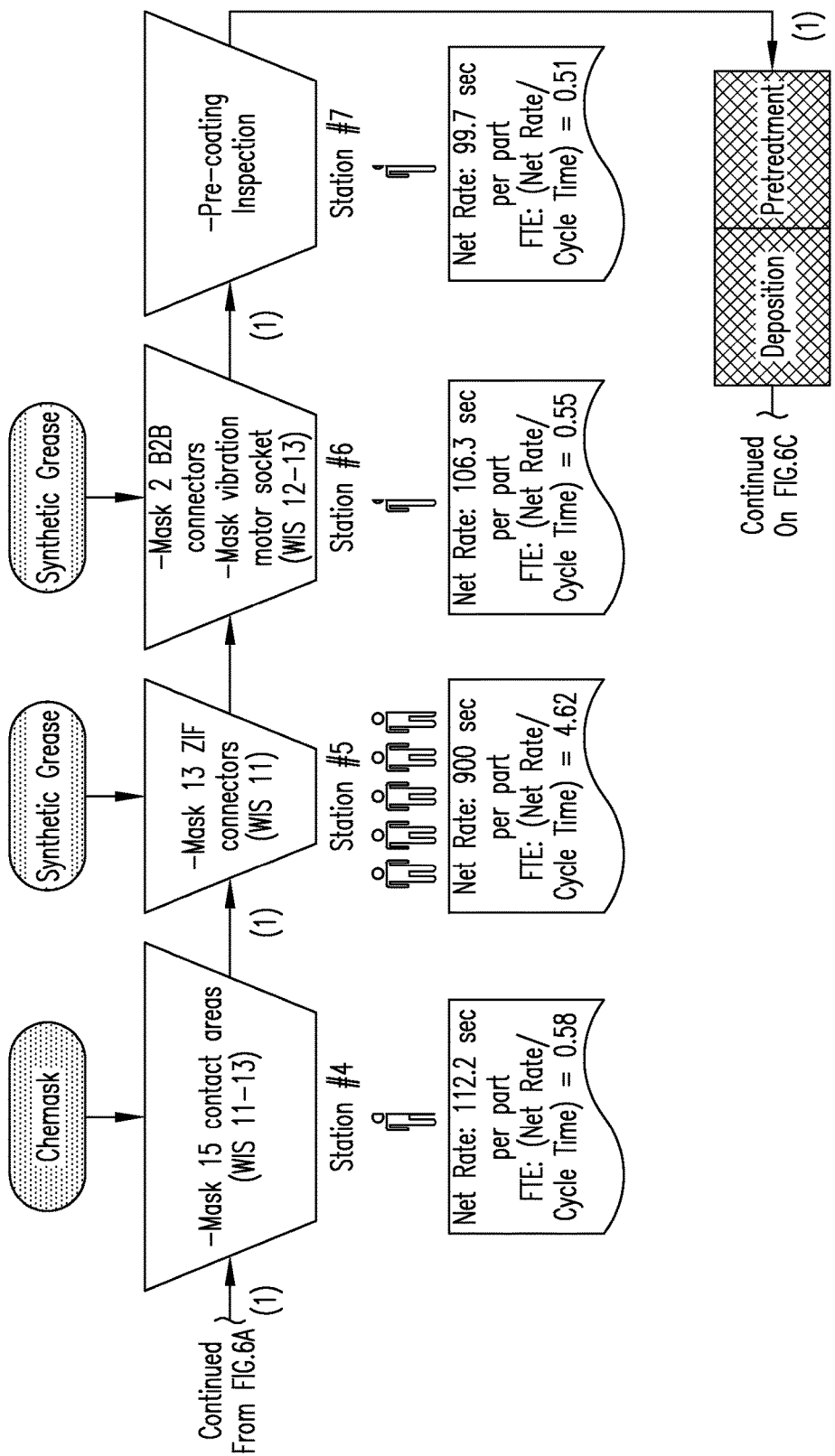
Figure 6C:
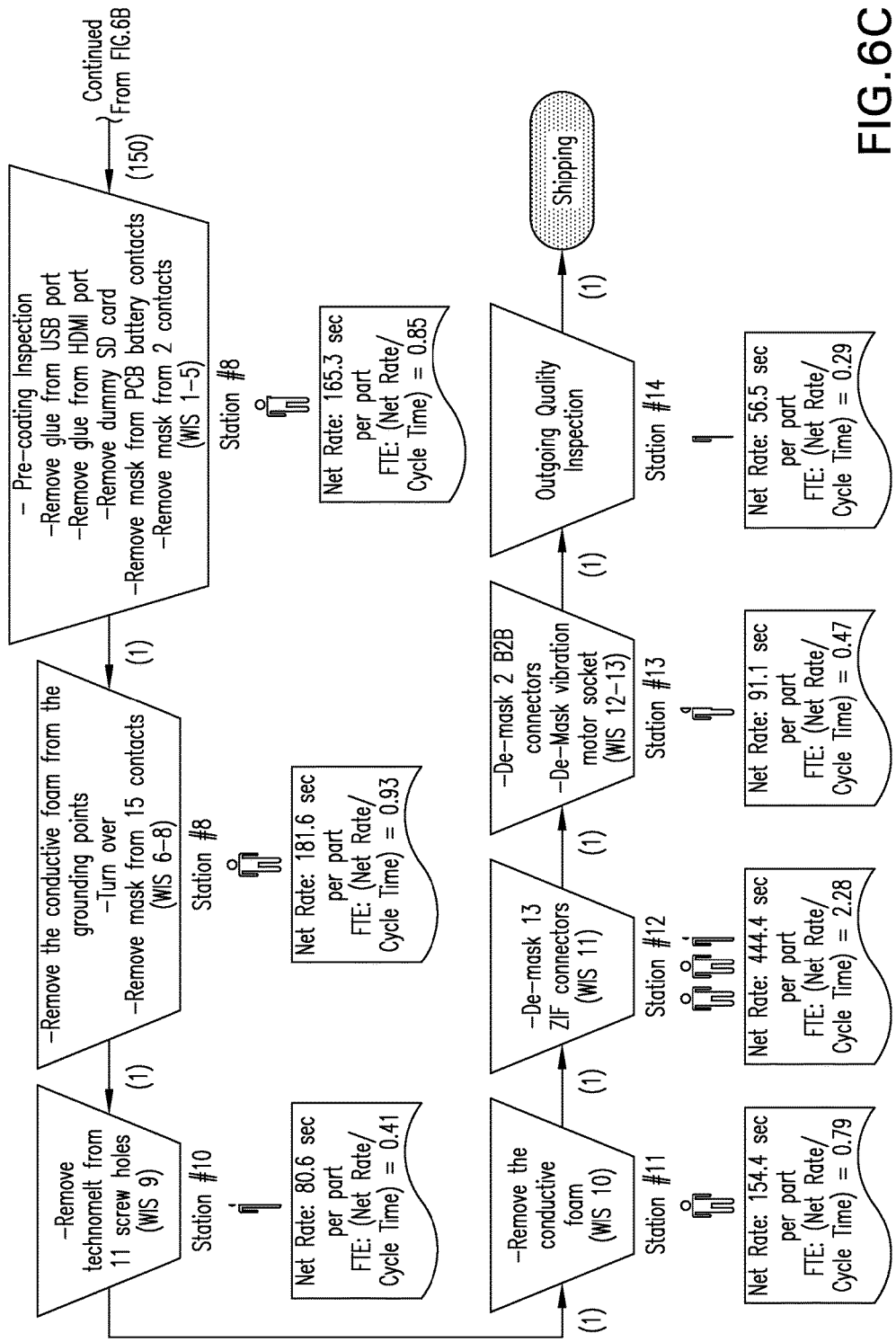
Figure 7A:
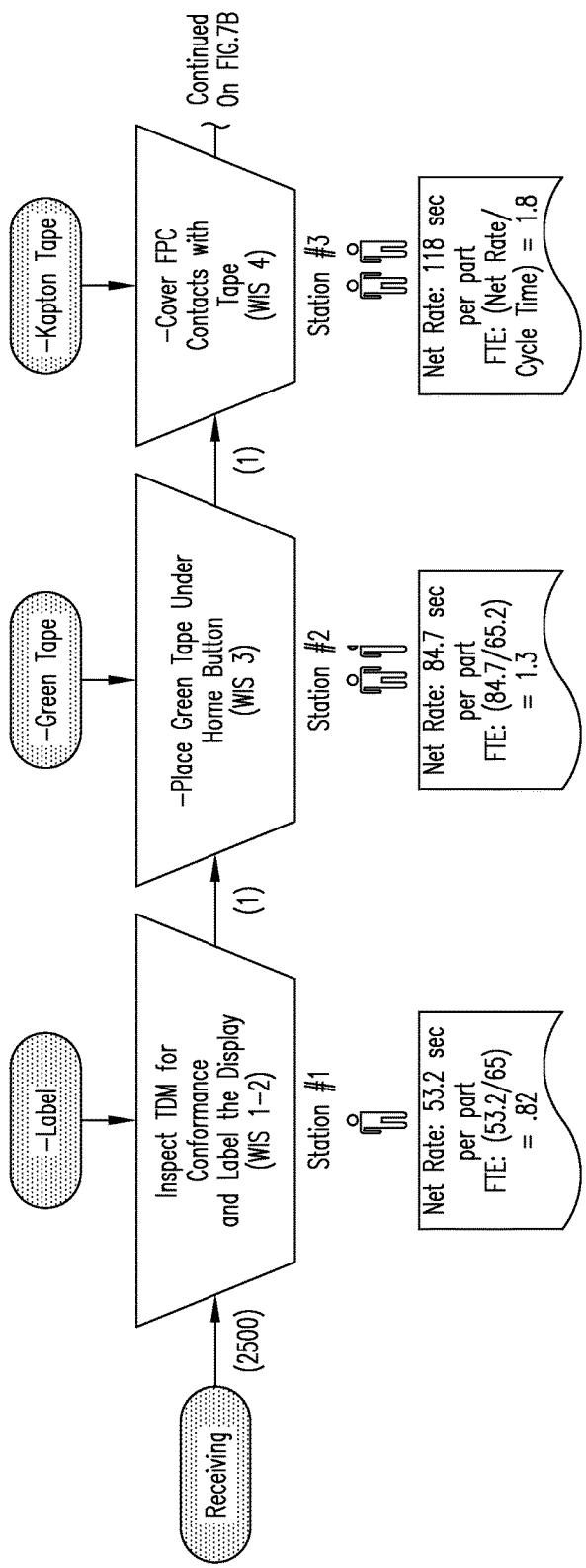
Figure 7B:
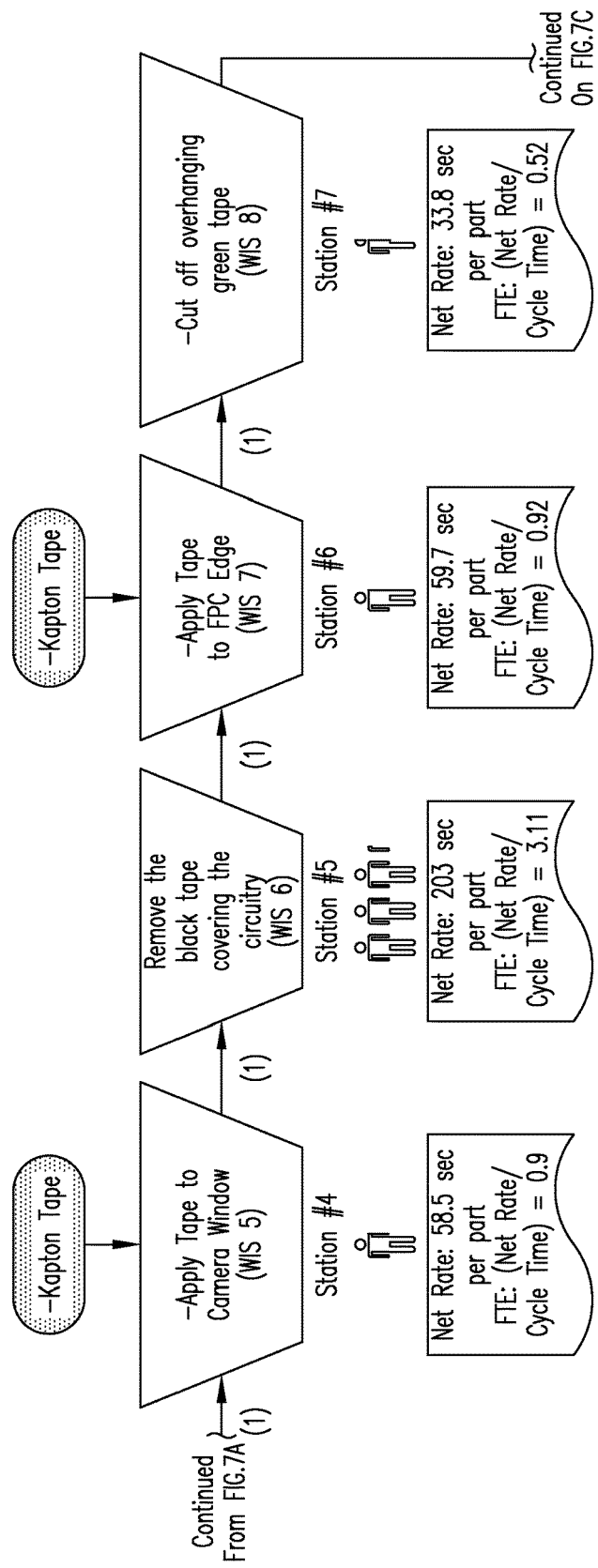
Figure 7C:
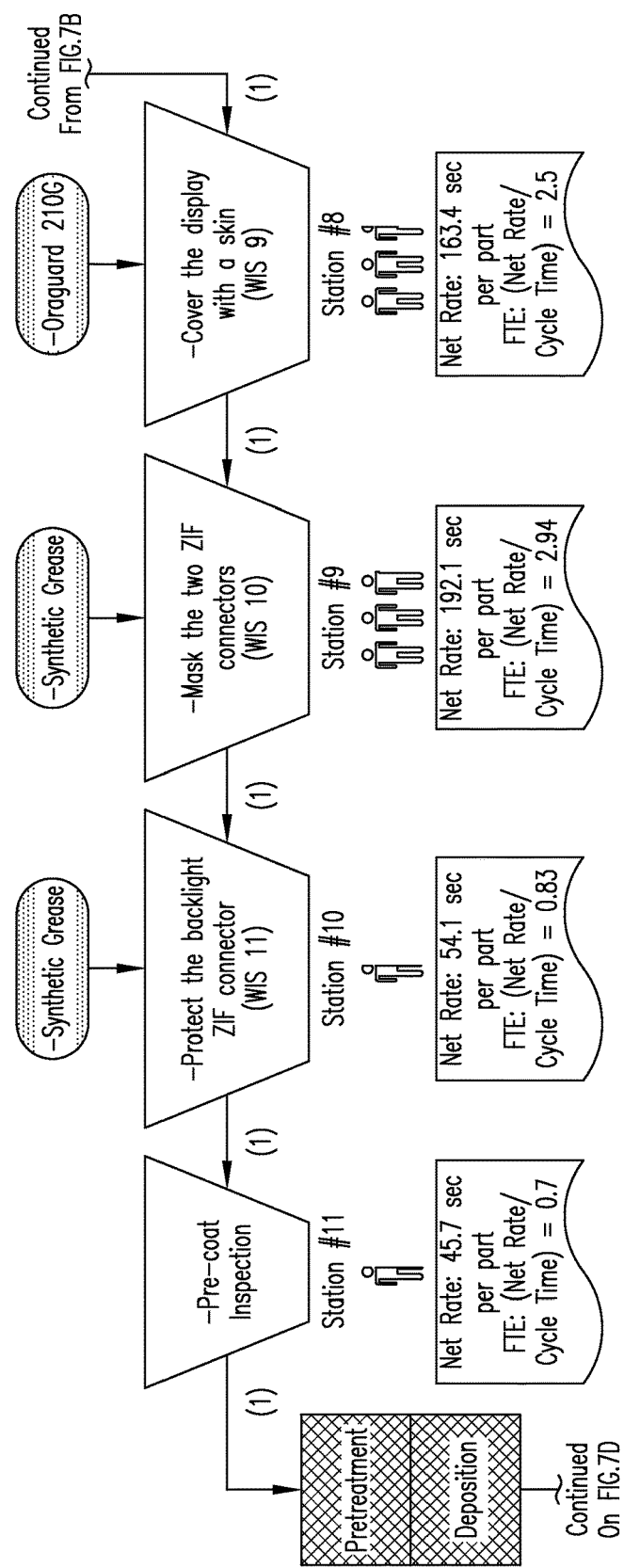
Figure 7D:
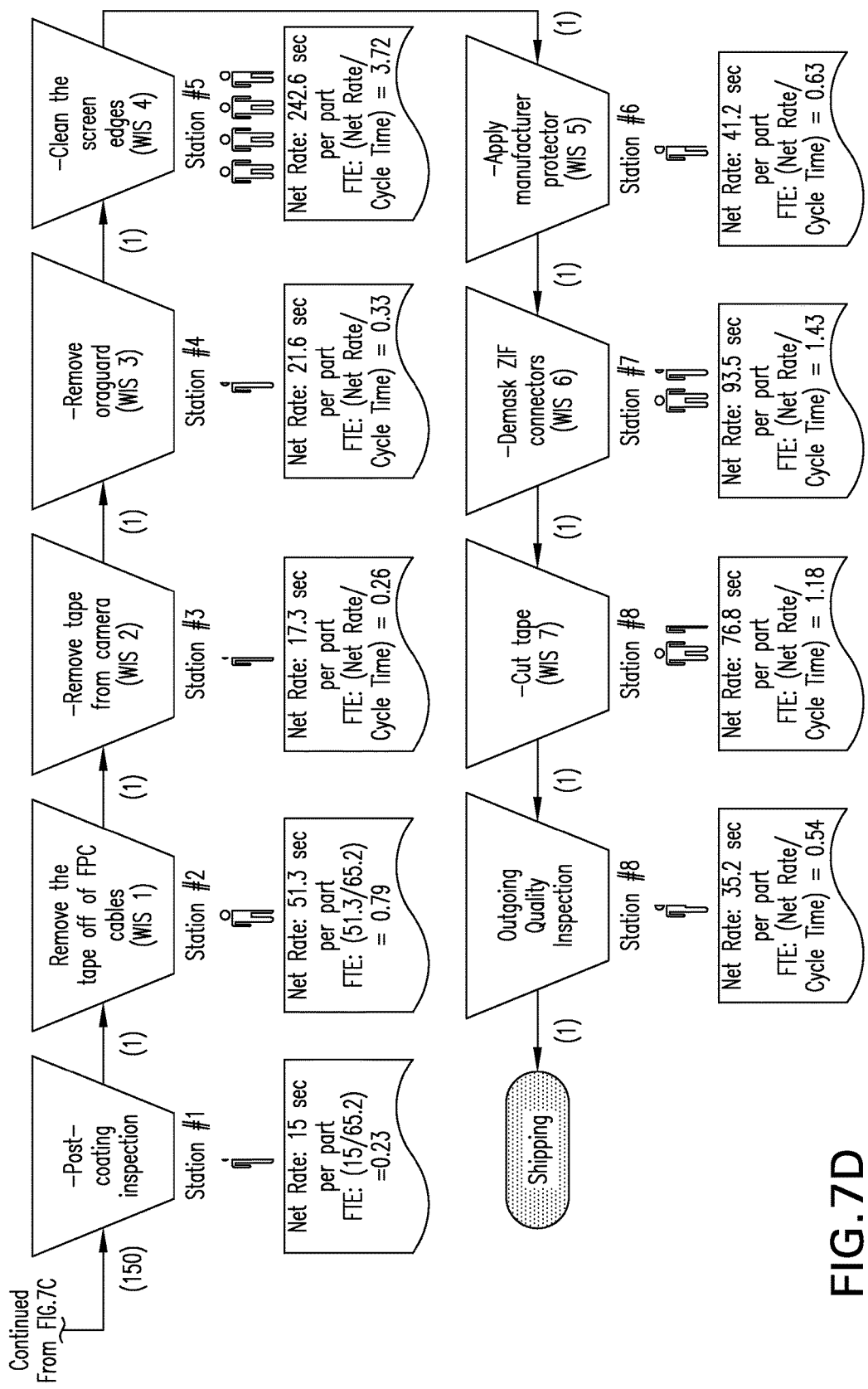

The flow diagram of FIGS. 6A-C illustrates an embodiment of process flow for preparing a motherboard assembly of an electronic device (in this case, a tablet computing device) for application of a protective coating, for protectively coating the motherboard assembly and for post-coating processing of the motherboard assembly. For the sake of simplicity, a motherboard assembly may also be referred to herein as a "motherboard."

Incoming Inspection

Upon receiving the motherboard assembly, or main board, the motherboard assembly may be inspected for damage and to ensure that it is ready to be masked. In some embodiments, the locations that are inspected may be locations that are predetermined by the device manufacturer, the party responsible for applying the protective coating to the motherboard assembly or some other party. Without limitation, the motherboard assembly may be inspected for physical damage (e.g., dents, bent or chipped components, heavy scratching on electrical traces) at a variety of locations, missing features (e.g., pins). If any damage is present or the motherboard assembly otherwise fails the incoming inspection, the motherboard assembly may be quarantined.

In a specific embodiment, the following features and/or components on a motherboard assembly may be inspected:

A. Shields: the only shield on the motherboard assembly should be over the heat sink.

B. Conductive foams: ensure that all conductive foams that are supposed to be on the motherboard assembly are present.

C. Confirm that all flexible printed circuit (FPC) connectors are detached.

D. Confirm that all fans have been removed.

E. Inspect zero insertion force (ZIF) connectors for cracks.

F. Inspect the heat sink; it should not be bent.

G. If mother board does not conform to any of the foregoing inspection points, perform the following tasks: photograph the area(s) of concern; record information about the area(s) of concern; notify the production manager.

H. Label the motherboard assembly, indicating that it has passed inspection; scan the label.

Remove the label from the SSD card; place it on the printed circuit board (PCB) of the motherboard assembly, next to the SSD card; all edges of the label should be secured to the PCB.

Masking

If the motherboard assembly passes inspection, it may proceed to masking. A number of different materials and equipment may be used to mask components and/or features of the motherboard. Some fluid masking materials (e.g., hot glue) may be dispensed (e.g., using the CHAMP 10 LCD hot glue gun available from Glue Machinery Corporation and a 1.5 mm inner diameter (ID), 1.8 mm outer diameter (OD) nozzle tip (e.g., Glue Machinery Corp. PN 3663) or any other suitable type of nozzle), as necessary or desired. Other fluid masking materials, such as liquid latex, may be dispensed using a fluid dispenser and an appropriately sized tip. A non-hardenable semisolid masking material (e.g., a synthetic grease, an anti-corrosive gel) may also be used to mask certain features and/or components of the motherboard assembly. Supports and/or a fixture may be used to hold the motherboard assembly as the fluid masking material(s) is (are) applied to the motherboard assembly.

Any HDMI ports on the motherboard assembly may be protected with hot glue. The tip of a nozzle of a hot glue gun may be placed in the center one side of an HDMI port, and the hot glue may be injected into the port. The hot glue gun may heat the hot glue to a temperature of about 160° C. and injected at a pressure of about 50 psi. As the hot glue is injected, the tip of a nozzle of the hot glue gun may be withdrawn from the port. A portion of the hot glue may protrude from the HDMI port to facilitate the later removal of the mask from the HDMI port. The foregoing process is repeated on the other side of the port of the HDMI connector. The hot glue-injection process may last for about 2.5 seconds per side of the HDMI port.

Each USB port of the motherboard assembly may be masked in the same manner as the HDMI port(s). The total amount of time required to mask each USB port may be slightly less than the time required to mask an HDMI port (e.g., about 4.5 seconds for a USB port as opposed to 5 seconds or more to mask an HDMI port).

Contacts on the motherboard assembly may also be masked. Any contacts that are shielded may be exposed, for example, by removing any covers or caps (e.g., a cap on the battery contacts). A suitable fluid masking material may then be applied to the contacts. For example, a liquid latex may be applied to protruding contacts, while hot glue may be applied to relatively flat contacts.

The motherboard may then be placed upon and supported by stands. With the motherboard in place, as shown in the larger image above, hot glue may be introduced into each screw hole. Care should be taken not to allow the hot glue to contact any of the circuitry of the motherboard.

A card slot on the motherboard may be masked by injecting synthetic grease into its detect switch and placing an insert into the card slot, or receptacle, to protect the contacts therein.

Contacts on the motherboard may also be masked. A fluid masking material, such as liquid latex, may be used to mask the contacts on the motherboard.

ZIF connectors may also be masked. One embodiment for masking each ZIF connector includes the use of synthetic grease or another non-hardenable semisolid masking material. The synthetic grease may be injected into each ZIF connector with a syringe having a 20 gauge, 0.5 inch tip, and under a pressure of about 40 psi. More specifically, each ZIF connector may be masked with four (4) strips of synthetic grease, as follows: (1) a first strip across the front of the receptacle of the ZIF connector; (2) press the first strip into the receptacle of the ZIF connector; (3) a second strip across the front of the receptacle of the ZIF connector; (4) a third strip under the hinge of the ZIF connector; (5) close the hinge; (6) a fourth strip across the top of the hinge. In addition, synthetic grease may be applied around an outer periphery of the ZIF connector.

Each B2B connector may also be masked with synthetic grease or another non-hardenable semisolid masking material. In a specific embodiment, four (4) strips of synthetic grease may be applied across the connector, covering all sides and edges inside and outside of each B2B connector.

A vibration motor socket, if any, on the motherboard may also be masked with a non-hardenable semisolid masking material, such as a synthetic grease.

Coating

With the device masked, a protective coating may be applied to the device to form a protective coating on exposed portions of the motherboard and on the masks.

De-Masking

Once the protective coating has been applied, the device may be de-masked to expose the features and/or components that were previously masked. De-masking may be accomplished manually or with automated de-masking equipment.

Masks formed from hot glue may be removed each port (e.g., each HDMI port, each USB port) with side-to-side movement while pulling. In some embodiments, the contacts of the port may be lightly brushed or scraped to remove any residue of the mask therefrom.

An SD card reader may be de-masked by pressing the insert into the SD card slot at least two times, and then removing (e.g., pulling) the insert from the SD card slot. The non-hardenable semisolid masking material may be wiped from the SD card slot in any suitable matter (e.g., with a cleaning agent, such as a KIMWIPE® cleaning cloth, with an appropriate cleaning tool and a suitable cleaning agent).

Battery contacts may be de-masked by pulling the masks (e.g., masks formed from latex and/or hot glue) therefrom. Tweezers may be used to remove the masks from the battery contacts. Masks that have been formed from latex, hot glue and/or similar materials may also be removed from (e.g., pulled off of) the motherboard (e.g., from contacts, from screw holes).

Conductive foam on the ground pads (or ground contacts) may also be removed.

Each ZIF connector may be de-masked by cutting the protective coating at locations around and adjacent to the ZIF connector. The portion of the protective coating covering each ZIF connector may then be lifted away from the ZIF connector. The non-hardenable semisolid masking material may then be removed (e.g., cleaned) from the inside of at least one ZIF connector (e.g., with an appropriate cleaning tool and a suitable cleaning agent). Each B2B connector and a vibration motor socket, if any, may be cleaned in a manner similar to each ZIF connector.

Outgoing Inspection

After de-masking the motherboard assembly, the motherboard assembly may again be inspected for damage, as well as any residual mask materials. The post-coating inspection may include inspection of the coating to ensure that the device has been coated, inspection of various features and/or components to determine whether or not they have been coated (if desired) or whether or not residue of a mask remains thereon (if coating is not desired) and inspection of various features to ensure that they have not been damaged. In a specific embodiment, the contacts that were masked may be inspected to ensure that they have been properly cleaned and are free of damage, the screw holes may be inspected to ensure that they have been properly de-masked, the ground contacts (or ground pads) may be inspected to confirm that conductive foam has been removed therefrom and that they are not coated with the protective coating, each HDMI, USB, B2B and ZIF connector may be inspected to ensure that the mask has been removed therefrom and that the contacts are not coated with the protective coating. If any of the foregoing issues are detected, the device may be quarantined.

EXAMPLE 5

The flow diagram of FIGS. 7A-D illustrates an embodiment of process flow for preparing a tablet display module (TDM) of an electronic device (e.g., the tablet computing device of EXAMPLE 4) for application of a protective coating, for protectively coating the TDM and for post-coating processing of the TDM.

Incoming Inspection

Upon receiving the TDM, the TDM may be inspected for damage and to ensure that it is in condition to be masked. In some embodiments, the locations that are inspected may be locations that are predetermined by the device manufacturer, the party responsible for applying the protective coating to the device or some other party. Without limitation, the device may be inspected at a variety of locations. In a specific embodiment, each TDM may be inspected to ensure that a protector remains in place on the display and that the display is free of visible damage (e.g., discoloring, scratches, cracks), FPC connectors are in place and free of visible damage (e.g., tearing), ZIF connectors are empty and that black tape installed by the manufacturer remains on circuitry. If the TDM does not meet any of these parameters, it may be quarantined. In some embodiments, if the TDM does not conform to any inspection point (e.g., the specific inspection points identified above) the area(s) of concern may be photographed, information about each area of concern may be recorded and/or the production manager may be notified of any concerns. If the device passes inspection, an inspection label may be affixed to it, and the label may be scanned.

Masking

If the TDM passes inspection, it may proceed to masking. A number of different materials and equipment may be used to mask components and/or features of the TDM. Adhesive-coated elements may include films or tapes, such as polyvinyl chloride (PVC) film (e.g., ORAGUARD 210) or polyimide tape (e.g., KAPTON tape). Liquid materials may be dispensed using a Nordson EFD (part number (PN) 7017041) dispensing system with a 20 gauge tapered dispensing tip (Nordson PN 7018158) or other type, as necessary or desired. CHEMASK CM8 liquid latex may be used as a hardenable fluid masking material. Synthetic grease, such as SUPER LUBE synthetic multi-purpose grease, an embodiment of a non-hardenable semisolid masking material, may also be used to mask certain features and/or components of the TDM. Supports and/or a fixture may be used to hold the TDM in place as masks are applied to or formed on the TDM.

A temporary film may be applied to the display. In a specific embodiment, a PVC film having dimensions that correspond to dimensions of the display may be applied to the display. Application of the temporary film may include ensuring that latches of ZIF connectors are lying down, tucking FPC connectors under the TDM and removing the protective film that was installed on the display by the manufacturer. The temporary film may then be aligned with and applied to the display in any suitable manner. Bubbles may be removed from the temporary film, and edges of the temporary film that extend beyond the lateral extent of the display may be removed.

Any manufacturer-installed tape that covers circuitry of the TDM may be removed from the circuitry. Removal of the tape from the circuitry may include removing tape from the FPC and cutting the tape along the top edge of the circuit board, peeling the tape and pulling the tape from off of the major surface of the circuit board (and other tape on the "pen") and from beneath or behind the display.

The exposed end of each FPC may be masked by covering the contacts at the exposed end with polyimide tape. Specifically, half of the width of a piece of polyimide tape may be applied to contacts on one side of the FPC, with the other half of the width of the piece of polyimide tape extending beyond the end of the FPC. The piece of tape may then be folded back on itself but not the FPC and secured in place over the contacts on the opposite side of the FPC. The polyimide tape may then be pressed tightly in place.

Polyimide tape may also be applied to the edges of the back side (i.e., the side from which the display is not visible) of the TDM.

Zero insertion force (ZIF) connectors of the TDM may also be masked. One embodiment for masking each ZIF connector includes the use of a non-hardenable semisolid masking material, such as a synthetic grease (although an anti-corrosive gel or another suitable material may also be used). The synthetic grease may be injected into each ZIF connector with a syringe having a 20 gauge, 0.5 inch stainless steel tip, and under a pressure of about 40 psi. More specifically, each ZIF connector may be masked with four (4) strips of synthetic grease, as follows: (1) a first strip across the front of the receptacle of the ZIF connector; (2) press the first strip into the receptacle of the ZIF connector; (3) a second strip across the front of the receptacle of the ZIF connector; (4) a third strip under the hinge of the ZIF connector; (5) close the hinge; (6) a fourth strip across the top of the hinge. In addition, synthetic grease may be applied around the outer periphery of the ZIF connector.

Each ZIF connector for a backlight for the display may also be masked. Masking of each backlight ZIF connector may include removing an FPC from the ZIF connector. With the FPC connector removed from the ZIF connector, two strips of synthetic grease (or another suitable non-hardenable semisolid masking material) may be placed on the ZIF connector—a first on the front of the ZIF connector; a second on the hinge of the ZIF connector. The FPC connector may then be reinserted into the ZIF connector and the hinge may be closed. A third strip of synthetic grease (or another suitable non-hardenable semisolid masking material) may then be applied to the top of the hinge. The synthetic grease may be applied with a syringe having a 20 gauge, 0.5 inch stainless steel tip, and under a pressure of about 40 psi.

Coating

With the TDM masked, the TDM may be subjected to coating processes to form a protective coating on exposed portions of the TDM and on the masks.

De-Masking

Once the protective coating has been applied to the TDM, the TDM may be de-masked to expose the features and/or components that were previously masked. De-masking may be accomplished manually or with automated de-masking equipment.

Masks that have been formed with tape (e.g., the mask on the end of each FPC, the mask at the edge of the TDM) may be removed by securing the component to which the tape is secured, and then peeling the tape from that component.

The temporary film on the display may also be removed by peeling. In addition, any protective coating on the edges of the display may be removed therefrom (e.g., by ablation, cutting, scoring, scraping). Thereafter, the display may be inspected for cleanliness and the display protector that was originally applied by the manufacturer (or a substitute protector) may be reapplied to the display.

Each ZIF connector may be de-masked by cutting, scoring or otherwise weakening the protective coating at locations around and adjacent to that ZIF connector. The portion of the protective coating covering each ZIF connector may then be lifted away from the ZIF connector. Synthetic grease (or any other non-hardenable semisolid masking material that was used) may then be removed (e.g., cleaned) from the inside of each ZIF connector (e.g., with an appropriate cleaning tool and a suitable cleaning agent).

A portion of the protective coating that covers the back side of the TDM may then be cut and/or selected portions of that protective coating may be removed from the back side of the TDM.

Outgoing Inspection

After de-masking the TDM, the TDM may again be inspected. The post-coating, post-de-masking inspection may include inspection of the coating to ensure that the device has been coated, inspection of various features and/or components to determine whether or not they have been coated (if desired) or residue of a mask remains thereon (if coating is not desired) and inspection of various features to ensure that they have not been damaged. In a specific embodiment, the display may be inspected to ensure that the display protector has been properly applied, the back side of the TDM may be inspected to ensure that the masking tape has been removed from all of its edges, the back side of the TDM may also be inspected to ensure that the protective coating has been removed from the areas designated above, the FPCs may be inspected to ensure that their contacts are clean, each ZIF connector may be inspected to ensure that its mask has been completely removed and that its contacts are clean, and labels and tape on the TDM may be inspected to ensure that they remain following the masking, coating and de-masking processes. If any of the foregoing issues are detected, the device may be quarantined.

EXAMPLE 6

Figure 8:
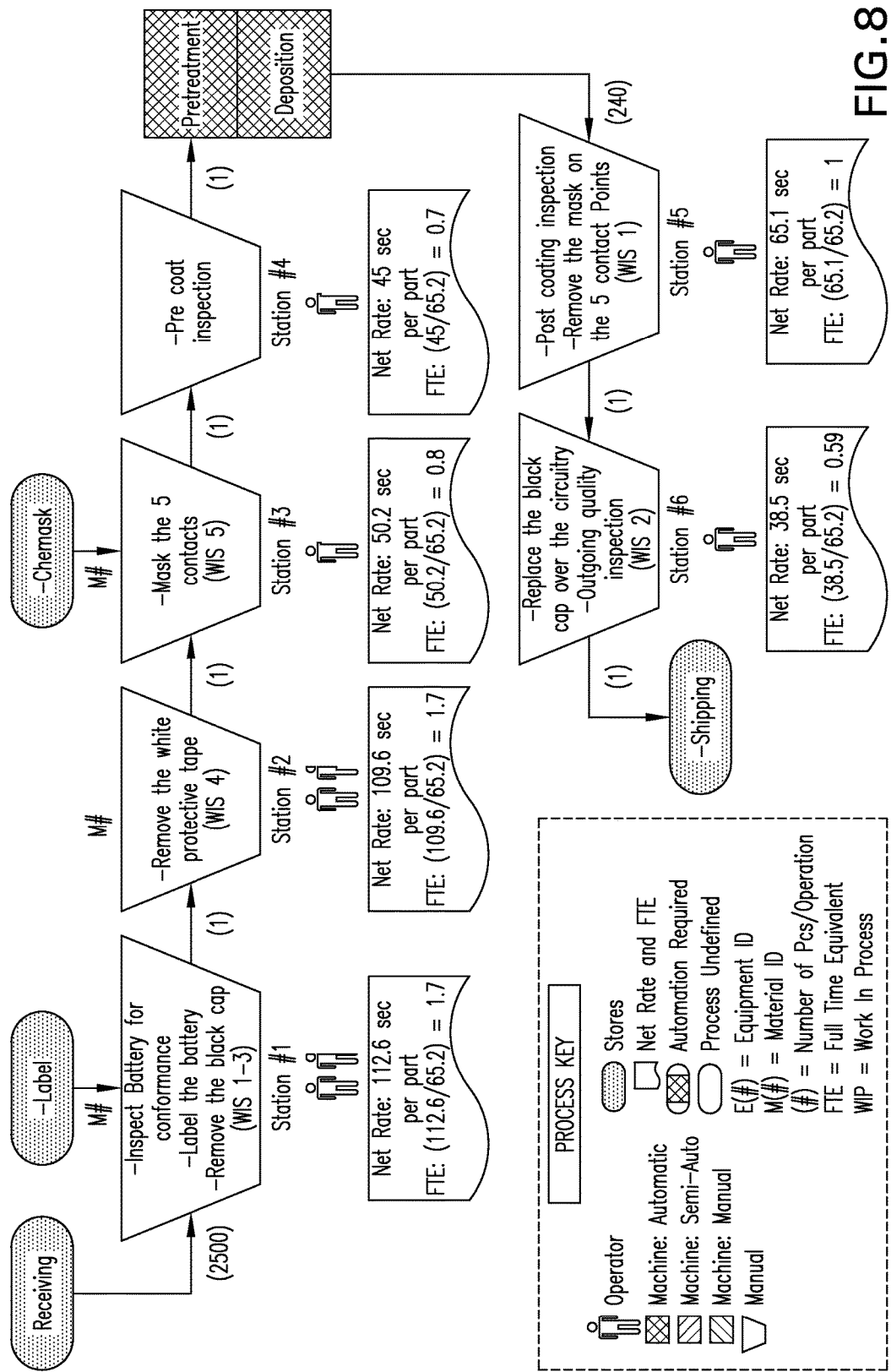

The flow diagram of FIG. 8 illustrates an embodiment of process flow for preparing a battery of an electronic device (e.g., the tablet computing device of EXAMPLES 4 and 5) for application of a protective coating, for protectively coating the battery and for post-coating processing of the battery.

Incoming Inspection

Upon receiving the battery, the battery may be inspected for damage and to ensure that it is in condition to be masked. In some embodiments, the locations that are inspected may be locations that are predetermined by the device manufacturer, the party responsible for applying the protective coating to the device or some other party. Without limitation, the battery may be inspected at a variety of locations. In a specific embodiment, each battery may be inspected to ensure that it is wrinkle-free, that its corners are free of damage, that a black cap is in place between the battery packs, that white paper covers both sides of the contacts and that the voltage across the two large contacts of the battery has an appropriate measure (e.g., 7.6 V±0.1 V). If the battery does not meet any of these parameters, the device may be quarantined. In some embodiments, if the battery does not conform to any inspection point (e.g., the specific inspection points identified above) the area(s) of concern may be photographed, information about each area of concern may be recorded and/or the production manager may be notified of any concerns.

If the battery passes inspection, an inspection label may be affixed to it. Application of the inspection label to the battery may include removal of a plastic cover from the battery. With the label in place, the label may be scanned.

Masking

If a battery passes inspection, it may proceed to masking. A number of different materials and equipment may be used to mask components and/or features of the battery. For example, a fluid masking material, such as hot glue (e.g., that available under the TECHNOMELT trademark), may be dispensed onto selected features and/or components of the battery using hot glue gun available from Glue Machinery Corp. (CHAMP 10 LCD) and a 1.5 mm inner diameter (ID), 1.8 mm outer diameter (OD) nozzle tip (e.g., Glue Machinery Corp. PN 3663) or any other suitable type of nozzle, as necessary or desired.

The battery may be prepared for masking by removing any caps, covers or tape. In this particular embodiment, a cap may be removed from a location between the battery packs. In addition, tape may be removed from the battery packs.

Contacts of the battery may then be masked with hot glue. The tip of a nozzle of a hot glue gun may be placed in the center one side of an HDMI port, and the hot glue (e.g., TECHNOMELT hot glue) may be injected into the port. The hot glue may be heated to a temperature of about 160° C. and applied under a pressure of about 50 psi. As the hot glue is applied, the tip of the nozzle may be withdrawn from the port. The following image illustrates an embodiment of the foregoing process:

Coating

With the battery masked, the battery may be subjected to coating processes to form a protective coating on exposed portions of the battery and on the masks.

De-Masking

Once the protective coating has been applied to the battery, the battery may be de-masked to expose the features and/or components that were previously masked. De-masking may be accomplished manually or with automated de-masking equipment. In a specific embodiment, masks that have been formed with hot glue may be peeled from the battery. More specifically, the masks may be removed from the contacts of the battery with a pry tool. A pry tool may be pressed against each edge of the mask to tear the protective coating at the edges of each mask, and to loosen the edges of each mask from the battery. Each mask may then be removed from the battery.

With the contacts again exposed, the contacts may be cleaned and any covers or other components that were removed from the battery may be replaced.

Outgoing Inspection

After de-masking the battery, the battery may again be inspected. The post-coating inspection may include inspection of the coating to ensure that the device has been properly coated, inspection of various features and/or components to determine whether or not they have been coated (if desired) or residue of a mask remains thereon (if coating is not desired) and inspection of various features to ensure that they have not been damaged. If the battery does not pass inspection, it may be quarantined.

EXAMPLE 7

One or more buttons of an electronic device (e.g., the tablet computing device of EXAMPLES 4, 5 and 6) may be masked with a suitable fluid masking material, such as a non-hardenable semisolid masking material (e.g., synthetic grease, anti-corrosive gel). In a specific embodiment, synthetic grease may be injected into a hole at each side of the button. A syringe with a 20 gauge, 0.5 inch stainless steel tip may be used to inject the grease at a pressure of about 45 psi. The syringe may be gradually withdrawn from the hole as the synthetic grease is introduced into and fills the hole. Synthetic grease may then be applied across the top of the button and to an underside of the button. The synthetic grease may remain in place to prevent moisture from entering into the housing of the device through the button.

A protective coating may then be applied to (e.g., coated onto, etc,) each button.

EXAMPLE 8

Incoming Inspection

Upon receiving the motherboard assembly, or main board, of a wearable electronic device, the motherboard assembly may be inspected for damage. In some embodiments, the locations that are inspected may be locations that are predetermined by the device manufacturer, the party responsible for applying the protective coating to the device or some other party. Without limitation, the device may be inspected for physical damage (e.g., dents, bent or chipped components, heavy scratching on electrical traces) at a variety of locations, missing features (e.g., pins). If any damage is present, the device may be quarantined.

Masking

If the motherboard assembly of the wearable electronic device passes inspection, it may proceed to masking. A number of different materials and equipment may be used to mask components and/or features of the device. Liquid materials may be dispensed using a fluid dispenser which may be a Nordson EFD (part number (PN) 7017041) dispensing system with a 20 gauge tapered dispensing tip (e.g., Nordson PN 7018158) or other type, as necessary or desired. A fixture may also be used to hold the device as the liquid material is applied to the device. A liquid latex, such as CHEMASK, may be used as the liquid material.

TABLE 1

Motherboard assembly

| Area | Masking | | CTQ |
|---|---|---|---|
| B2B Connectors | Material | Grease | Name: Super Lube Synthetic Grease |
| | Method | Application | Material covers both sides of every pin |
| | | | Material does not touch any nearby components |
| | Machine | Dispenser | Name: Nordson Ulitimus I |
| | | | Material: Super Lube Synthetic Grease |
| | | | Pressure: 25 psi ± 1 |
| | | | Shot Time: Infinite |
| | | | Nozzle Type: 20 gauge stainless steel |
| RF Connectors | Material | Grease | Name: Super Lube Synthetic Grease |
| | Method | Application | Material fills the inside of the RF connector |
| | | | Material does not touch any nearby components |
| | Machine | Dispenser | Name: Nordson Ulitimus I |
| | | | Material: Super Lube Synthetic Grease |
| | | | Pressure: 25 psi ± 1 |
| | | | Shot Time: Infinite |
| | | | Nozzle Type: 20 gauge stainless steel |

A first side of the device may be masked, as follows:
1. Ensure the settings on the automated dispensing equipment (e.g., the Nordson) EFD are the same as following table:

TABLE 2

EFD Settings

| Material | Pressure | Shot Time | Nozzle Type |
|---|---|---|---|
| CHEMASK but under mass production a synthetic grease may be used | 4.5 ± 1 psi | Infinite | 18 gauge tapered |

2. Apply liquid latex to the board-to-board (B2B) connector.
   a. Fill the channel between the two pin sets first.
   b. Apply liquid latex to all exposed sides of the pins.
   c. Do not let the liquid latex touch the nearby components.
3. Apply liquid latex inside and around the RF connector.
4. Apply liquid latex to the spring contact.

An alternative latex may be used to coat various features, including, without limitation, B2B pins and an RF connector.

A second side of the device may then be masked, as follows:
1. Apply liquid latex to each B2B connector.
   a. Fill the channel between pin sets first.
   b. Apply liquid latex to all exposed sides of the pins.
   c. Do not let the liquid latex touch the nearby components.
2. Apply liquid latex inside and around the RF connector.
3. Place the device in the rack for coating.

Alternatively, features and/or components, such as B2B pins and/or an RF connector may be coated with latex. Synthetic grease may also be applied to certain components, such as holes and/or gaps (e.g., at the bases of canisters, stacked assemblies).

Coating

With the motherboard assembly masked, a protective coating may be applied to the motherboard assembly.

De-Masking

Once the protective coating has been applied, the motherboard assembly may be de-masked to expose the features and/or components that were previously masked. In some embodiments, de-masking may be accomplished manually, as opposed to the dry-ice blasting which may be more common in mass production. Suitable tools for manual de-masking include, but are not limited to, a magnifying glass or microscope, a cutting tool and tweezers. Corresponding tools (with the exception of the magnifying glass or microscope), may be used with automated de-masking equipment.

The following acts may be performed to de-mask a first side of the motherboard:

First Side:
1. Score the coating around the B2B connector; do not allow the blade to touch components or solder terminals;
2. Score the coating around the RF connector; do not allow the blade to touch components or solder terminals;
3. Score the base of the contact finger;
4. Remove the mask from the contact finger, B2B, and RF connector (e.g., with tweezers).

Second Side:
1. Score the coating around the small and large B2B connectors;
2. Score the coating around the RF connector;
3. Remove the mask from the B2B and RF connectors.

Conductive Traces (e.g., Ground Trace):
1. Score the protective coating along the inside edge of the conductive trace; all scoring should be performed on the trace itself and not on the solder mask (i.e., at the yellow areas yellow in the image above) adjacent to the conductive trace;
2. Score the protective coating along the outside perimeter of the red areas shown in the image above;
3. Peel the protective coating away from the device without scratching the ground trace.

Outgoing Inspection

After de-masking the motherboard, the motherboard assembly may again be inspected for damage. The post-coating inspection may include inspection of the coating to ensure that the device has been coated, inspection of the features and/or components (e.g., B2B connectors, RF connectors) to determine whether or not they have been coated or residue of a mask remains thereon, inspection of spring contacts for protective coating and/or mask residue, de-masking failure, large coating flaps and/or heavy scratching on conductive traces. If any of the foregoing issues are detected, the device may be quarantined.

EXAMPLE 9

Incoming Inspection

Upon receiving a daughter board assembly of an electronic device (e.g., the wearable electronic device of EXAMPLE 8), the daughter board assembly may be inspected for damage. For the sake of simplicity, a daughter board assembly may also be referred to herein as a "daughter board."

In some embodiments, the locations that are inspected may be locations that are predetermined by the device manufacturer, the party responsible for applying the protective coating to the device or some other party. Without limitation, the daughter board assembly may be inspected for physical damage (e.g., dents, bent or chipped components, heavy scratching of electrical traces, damage to spring contacts (e.g., noticeable deflection), damaged actuators on zero insertion force (ZIF) connectors) at a variety of locations, missing features (e.g., pins, ZIF connector actuators). If any damage is present, the device may be quarantined.

Masking

If a daughter board assembly passes inspection, it may proceed to masking. A number of different materials and equipment may be used to mask components and/or features of the daughter board assembly. Adhesive-coated elements may include strips, such as polyimide tape, which may be KAPTON® tape, having widths of 1 mm, 2 mm and/or 4 mm; decals, which may be pre-cut; etc. Liquid materials may be dispensed using a Nordson EFD (part number (PN) 7017041) dispensing system with an 18 gauge tapered dispensing tip (Nordson PN 7018158) or other type, as necessary or desired. CHEMASK® CM8 liquid latex may be used as the liquid material. Synthetic grease, such as SUPER LUBE® synthetic multi-purpose grease, or any other suitable non-hardenable semisolid masking material may also be used to mask certain features and/or components of the daughter board assembly. A fixture may be used to hold the daughter board assembly in place as masks are applied to or formed on the daughter board assembly.

The following table provides further detail as to how certain features and/or components of the daughter board assembly may be masked:

TABLE 3

| Daughter board assembly | | | |
|---|---|---|---|
| Area | | Masking | CTQ |
| Letbond areas | Material | Tape | Name: Kapton<br>Width: 1 mm ± 0.1<br>Length >105 mm |
| | Material | Tape | Name: Kapton<br>Width: 2 mm ± 0.1<br>Length >105 mm |
| | Method | Application | Tape adhered to entire surface<br>Material does not touch any components besides main optical |
| | Material | Sticker | Name: Kapton<br>Die cut to fit |
| | Material | Liquid Latex | Name: Chemask HV |
| | Method | Application | Material covers Letbond areas<br>Material does not touch any components besides main optical |
| | Machine | Dispenser | Name: Nordson Ulitimus I<br>Material: Chemask HV<br>Pressure: 8 psi ± 1<br>Shot Time: Infinite<br>Nozzle Type: 18 gauge tapered tip |
| Main Optical Component | Material | Liquid Latex | Name: Chemask HV |
| | Method | Application | Material covers the main optical component<br>Material does not touch any components besides main optical |
| | Machine | Dispenser | Name: Nordson Ulitimus I<br>Material: Chemask HV<br>Pressure: 8 psi ± 1<br>Shot Time: Infinite<br>Nozzle Type: 18 gauge tapered tip |
| Test Points | Material | Tape | Name: Kapton<br>Width: 4 mm ± 0.1<br>Length >105 mm |
| | Method | Application | Material adhered to entire surface<br>Material covers all test points except TP10 |
| | Material | Liquid Latex | Name: Chemask HV |
| | Method | Application | Material covers TP10<br>Material does not touch any components |

TABLE 3-continued

Daughter board assembly

| Area | Masking | | CTQ |
|---|---|---|---|
| | Machine | Dispenser | Name: Nordson Ulitimus I<br>Material: Chemask HV<br>Pressure: 8 psi ± 1<br>Shot Time: Infinite<br>Nozzle Type: 18 gauge tapered tip |
| ZIF Connector | Material Method | Grease Application | Name: Super Lube Synthetic Grease<br>Material encapsulates ZIP connector<br>Material does not touch any components besides ZIP |
| | Machine | Dispenser | Name: Nordson Ulitimus I<br>Material: Super Lube Synthetic Grease<br>Pressure: 30 psi ± 1<br>Shot Time: Infinite<br>Nozzle Type: 20 gauge stainless steel |
| | Material | Insert | Insert made to fit into and seal ZIP connector |

Various features and/or components of the daughter board assembly may be masked in different ways. Test points, or test contacts, on one side of the daughter board assembly, which enable testing of various circuits of the daughter board assembly and/or a subassembly of which the daughter board assembly is a part, may be masked in accordance with the following procedure:

1. Secure the daughter board by placing a stand at each of the four corners of panel that includes a plurality of devices, or boards, with a ZIF connector facing upwards.
2. Gather twelve (12) strips of 4 mm wide polyimide tape of appropriate length;
3. Apply the polyimide tape along rows covering several test points; the strips should be placed along the top and bottom of the ZIF connector and fully cover all test points except for test points to the sides of components that protrude from the board, such as the ZIF connector; the polyimide tape may be pressed down (e.g., with tweezers) to ensure that it is adhered to the entire surface of the daughter board.

Various letbond areas of the device (on the daughter board) may also be masked with polyimide tape, as follows:

1. Flip the daughter board and set it on the stands so that the optical components are facing upwards;
2. Gather twelve (12) strips of 1 mm wide polyimide tape of appropriate length (e.g., 120 mm) and six (6) pieces of 2 mm wide polyimide tape of appropriate length (e.g., 120 mm);
3. Apply the polyimide tape along the rows of boards; the 1 mm strips of polyimide tape can touch the middle optical component, but the 1 mm and 2 mm strips cannot touch any other components protruding from the board; the polyimide tape may be pressed against the surface of the board to ensure that it is adhered to the entire surface of the daughter board.

Once the adhesive-coated elements have been applied to the daughter board assembly, a liquid mask material (e.g., a hot melt adhesive, liquid latex) may be applied to one or more features or components of the daughter board assembly. In a specific embodiment, the following procedure may be used to apply liquid mask material to letbond areas of a daughter board assembly:

1. Ensure the settings on the automated dispensing equipment (e.g., Nordson EFD) are the same as in the following table:

TABLE 4

EFD Settings

| Material | Pressure | Shot Time | Nozzle Type |
|---|---|---|---|
| CHEMASK | 5 ± 1 psi | | 18 gauge tapered tip |

2. Apply liquid latex to the LEDs, letbond areas, and contact finger; apply a drop of liquid latex over the top surface of the LED; ensure that the liquid latex is applied to the tip of the contact finger; repeat this for all boards in the panel;
3. Flip the board and set the panel so that the ZIF faces upwards;

Apply a drop of liquid latex over one or more test points that remain exposed; do not let the liquid latex touch nearby components; repeat this step for all boards in the panel.

In addition to applying a liquid mask material to some of the features and/or components of the device, synthetic grease may also be used to mask one or more features and/or components of the device (e.g., a ZIF connector). The following process may be used to apply synthetic grease to the device:

1. Ensure the settings on the automated dispensing equipment (e.g., Nordson EFD) are the same as in the table below:

TABLE 5

EFD Settings

| Material | Pressure | Shot Time | Nozzle Type |
|---|---|---|---|
| Grease | 40 ± 2 psi | Infinite | 20 gauge stainless steel |

2. Apply a bead of synthetic grease around all 4 sides of the ZIF connector and to any exposed test points located adjacent to the ZIF connector;
3. Finish applying the synthetic grease over the top surface of the ZIF connector; check for openings in the synthetic grease that could expose the ZIF connector.

In addition to the masking techniques identified in the table above, a secondary conformal coating material (e.g., EMAX 904-GEL-SC Light-Cure Electronic Adhesives (UV cure)) can be added to areas that need to be protected from a protective coating material. Some features and/or components may only be partially covered with a masking material (e.g., the solder joints of LEDs), while other features and/or components may be completely covered. In a specific embodiment, a PVA DELTA 6 Selective Coating/Dispensing System may be used to apply the secondary conformal material, while a PVA UV1000 Ultraviolet Light Curing System may be used to cure the secondary conformal material and, thus, to define a mask therefrom.

Coating

With the daughter board assembly (or all of the devices of a panel) masked, the daughter board assembly may be subjected to coating processes.

De-Masking

Once the protective coating has been applied, the daughter board assembly may be de-masked to expose the features and/or components that were previously masked. In some embodiments, de-masking may be accomplished manually. Suitable tools for manual de-masking include, but are not limited to, a magnifying glass or microscope, a cutting tool, tweezers and a grease-removing agent (e.g., KIMWIPES®). Corresponding tools (with the exception of the magnifying glass or microscope), may be used with automated de-masking equipment.

The following acts may be performed to de-mask a second side of the daughter board assembly:
1. Set the panel on the fixture with the ZIF connector facing upwards;
2. Score the protective film at locations around any test point covered by the protective film;
3. Peel the latex mask and protective film off of each such test point;
4. Peel both 4 mm strips of polyimide tape at the same time from each board; the synthetic grease bubble on the ZIF connector should come off with the polyimide tape;
5. Wipe synthetic grease off of the ZIF connector with a KIMWIPE®.

The daughter board assembly may then be flipped and masks removed from its first side, as follows:
1. Set the panel on the stands with the optical components facing upwards;
2. Score the protective film at locations surrounding each mask formed from latex;
3. Peel the 2 mm polyimide tape off each board;
4. Peel both 1 mm strips of polyimide tape at the same time for each board; the latex mask on the main optical component should come off with the two 1 mm strips
5. Squeeze and remove the latex mask from the contact finger, LEDs, and top letbond area.

Outgoing Inspection

After de-masking the daughter board assembly, the daughter board assembly may again be inspected for damage. The post-coating inspection may include inspection of the coating to ensure that the daughter board assembly has been properly coated, inspection of the features and/or components (e.g., test points, ZIF connectors, LEDs) to determine whether or not they have been coated or residue of a mask remains thereon, or large flaps of protective coating or loose protective around any of the components that are supposed to be covered with protective coating. If any of the foregoing issues are detected, the daughter board assembly may be quarantined.

EXAMPLE 10

In an alternative process, a daughter board assembly of an electronic device (e.g., the wearable electronic device of EXAMPLES 8 and 9) may be prepared for coating by masking any optical sensors and ZIF connectors thereon. Processes such as those disclosed in EXAMPLE 9 above may be employed.

With the optical sensors and ZIF connectors masked, a protective coating may be conformally coated onto the device.

After coating, the protective coating may be selectively removed from predetermined locations of the daughter board assembly (e.g., from test points, letbond areas contact fingers). In a specific embodiment, dry ice blasting with or without templates may be used to remove areas of the protective coating that overlie the predetermined locations of the daughter board.

EXAMPLE 11

Incoming Inspection

Upon receiving a flexible circuit board, or an "I/O flex board," of an electronic device (e.g., the wearable electronic device of EXAMPLES 8, 9 and 10), the I/O flex board may be inspected for damage.

The locations of the I/O flex board that are inspected may be locations that are predetermined by the device manufacturer, the party responsible for applying the protective coating to the device or some other party. In some embodiments, the I/O flex board may be inspected for deformation, for the absence of a PSA liner or for physical damage (e.g., damage to the B2B connector, such as missing pins; physical damage to buttons; physical damage to optical components or a microphone; etc.). If any damage is present, the I/O flex board may be quarantined.

Masking

If the I/O flex board passes inspection, it may proceed to masking. A number of different materials and equipment may be used to mask components and/or features of the I/O flex board. Adhesive-coated elements may include tapes, such as polyimide tapes (e.g., KAPTON tapes) having widths of 4 mm. Liquid materials, such as TECHNOMELT hot glue, may be dispensed using hot glue gun available from Glue Machinery Corp. (CHAMP 10 LCD) and a 1.5 mm inner diameter (ID), 1.8 mm outer diameter (OD) nozzle tip (e.g., Glue Machinery Corp. PN 3663) or other type, as necessary or desired, a press tool (e.g. a 100 g press tool), a silicone press fixture and release paper.

TABLE 6

| IO Flex | | | |
|---|---|---|---|
| Area | | Masking | CTQ |
| Flex | Method | Handling | Intentional bends not damaged |
| Short Optical Component | Material | Tape | Name: Kapton<br>Width >3 mm<br>Length >3 mm |
| | Method | Application | Tape adhered to entire surface |
| | Material | Hot Glue | |
| | Method | Machine Dispensing | |

TABLE 6-continued

| | | IO Flex | |
|---|---|---|---|
| Area | | Masking | CTQ |
| Tall Optical Component and Microphone | Material | Kapton Tape | Name: Kapton<br>Width >3 mm<br>Length >8 mm |
| | Method | Application | Tape adhered to entire surface |
| | Material | Hot Glue | |
| | Method | Machine Dispensing | |
| B2B Connector | Material | Hot Glue | Name: Technomelt 003<br>Mix Ratio = 0.1 mL Orange Dye/1 kg Technomelt |
| | Machine | Dispenser | Name: Glue Machinery Champ 10<br>Temperature = 160° C. ± 6<br>Pressure = 55 psi ± 3<br>Nozzle Type: 1.5 mm ID, 1.8 mm OD |
| | Method | Machine Dispensing | Bead covers entire top surface of connector |
| | Machine | Press Tool | 100 g ± 5 |
| | Method | Press down | 5 seconds ± 1 |

Optical components and a microphone of the I/O flex board may be masked as follows:
 1. Cut two pieces of 4 mm wide polyimide tape; the pieces may be approximately 4 mm long and 9 mm long; the lengths do not need to be precise;
 2. Place the 4 mm long piece of polyimide tape on the short optical component;
 3. Place the 9 mm long piece of polyimide tape over both the microphone and the tall optical component;
 4. Press the polyimide tape against each component to make sure the tape is adhered to the entire surface.

The B2B connector of the I/O flex board may be masked as follows:
 1. Optionally, introduce synthetic grease into the B2B connector;
 2. The I/O flex board may be held by a fixture;
 3. Ensure the settings on the glue gun are the same as in the table below:

TABLE 7

| | Glue Gun Settings | | | |
|---|---|---|---|---|
| Material | Temperature | Pressure | Shot Time | Nozzle Type |
| Technomelt | 160° C. | 55 psi | Infinite | 1.5 mm ID<br>1.8 mm OD |

4. Place a bead of hot glue over the entire length of the B2B connector;
 5. Within ten (10) seconds, press the hot glue.
  a. Set the IO flex on the silicone pad fixture;
  b. Make sure none of the bends on the flex are touching the pad;
  c. Set the 100 g press tool directly over the bead of hot glue; a fixture could restrict how far the press tool can be pressed down
  d. Allow the weight of the tool itself to press the glue (e.g., for five (5) seconds, for ten (10) seconds);
  e. Use fingers to hold the tool upright;
 6. Set the device "glue side down" on a sheet of release paper.

Coating

With the device masked, the device may be subjected to coating processes.

De-Masking

Once a protective coating has been applied to the I/O flex board, the I/O flex board may be de-masked to expose the features and/or components that were previously masked. In some embodiments, de-masking may be accomplished manually. Suitable tools for manual de-masking include, but are not limited to, tweezers. Tools may be used with automated de-masking equipment.

The following acts may be performed to de-mask an I/O flex board:
 1. Secure the I/O flex board by holding the microphone and tall optical component with two fingers;
 2. Remove the polyimide tape from the shortest optical component;
 3. Secure the I/O flex board by holding the microphone and shorter optical component;
 4. Remove the polyimide tape from the taller optical component and the microphone;
 5. Flip I/O flex board to side with B2B connector;
 6. Secure the I/O flex board near the B2B connector;
 7. Remove the mask formed from the hot glue from the B2B connector; peel the mask lengthwise;
 8. If synthetic grease was used, remove synthetic grease from inside the B2B connector.

Outgoing Inspection

After de-masking the I/O flex board, the I/O flex board may again be inspected for damage. The post-coating inspection may include inspection of the I/O flex board for deformation, inspecting the PSA liner to ensure that it remains intact, inspecting features and/or components of the I/O flex board (e.g., the B2B connector, optical components, microphone, buttons) for physical damage (e.g., missing pins) and inspecting features and/or components for residue of the mask or protective coating on various parts (e.g., the B2B connector). If any of the foregoing issues are detected, the device may be quarantined.

With protective coatings on the subassemblies and the sub-assemblies de-masked, the sub-assemblies may be assembled with one another and with other components of a mobile telephone to provide an assembled mobile telephone.

Although the preceding disclosure provides many specifics, these should not be construed as limiting the scope of any of the ensuing claims. Other embodiments may be devised which do not depart from the scopes of the claims. Features from different embodiments may be employed in combination. The scope of each claim is, therefore, indicated and limited only by its plain language and the full scope of available legal equivalents to its elements.

What is claimed:

1. A method for applying a protective coating to an electronic device, comprising:
    applying a protective coating to selected areas of an electronic device comprising features and components, wherein applying the protective coating to the selected areas of the electronic device comprises masking the electronic device in areas of the electronic device other than the selected areas, coating the electronic device and de-masking the electronic device,
    wherein the masking the electronic device includes:
    applying flat preformed elements to flat features and/or components of the electronic device;
    applying a fluid masking material to at least some of the features and/or the components of the electronic device that protrude from the electronic device: and
    applying a non-hardenable semisolid masking material around at least one of said components that protrudes from a daughter board of the electronic device and/or within a receptacle of at least one of the components carried by the electronic device.

2. The method of claim 1, further comprising applying a second protective coating to selected areas of a motherboard of the electronic device, wherein applying the second protective coating to selected areas of the motherboard comprises masking the motherboard, coating the motherboard and de masking the motherboard.

3. The method of claim 2, wherein masking the motherboard includes applying a fluid masking material to at least one electrical connector carried by the motherboard.

4. The method of claim 1, further comprising applying a third protective coating to selected areas of the daughter board of the electronic device, wherein applying the third protective coating to selected areas of the daughter board comprises masking the daughter board, coating the daughter board and de-masking the daughter board.

5. The method of claim 4, wherein masking the daughter board includes applying flat preformed elements to flat features and/or components of the daughterboard and applying a fluid masking material to at least some features and/or components that protrude from the daughter board.

6. The method of claim 5, wherein masking the daughter board further includes applying a non-hardenable semisolid masking material around at least one component that protrudes from the daughter board and/or within a receptacle of at least one component carried by the daughter board.

7. The method of claim 1, wherein applying the non-hardenable semisolid masking material comprises applying the non-hardenable semisolid masking material to a zero insertion force connector.

8. The method of claim 1, further comprising applying a fourth protective coating to selected areas of a flexible printed circuit connector of the electronic device, wherein applying the fourth protective coating to selected areas of the flexible printed circuit connector comprises masking the flexible printed circuit connector, coupling the flexible printed circuit connector to a complementary element of an electrical connector, and coating the flexible printed circuit connector and the complementary element.

* * * * *